(12) United States Patent
Kawashima et al.

(10) Patent No.: US 6,727,982 B2
(45) Date of Patent: Apr. 27, 2004

(54) ILLUMINATION SYSTEM WITH PLURAL LIGHT SOURCES, AND EXPOSURE APPARATUS HAVING THE SAME

(75) Inventors: Haruna Kawashima, Tochigi-ken (JP); Kazuhito Isobe, Tochigi-ken (JP); Kazuki Furuta, Tochigi-ken (JP)

(73) Assignee: Canon Kabushiki Kaisha (JP)

( * ) Notice: Subject to any disclaimer, the term of this patent is extended or adjusted under 35 U.S.C. 154(b) by 66 days.

(21) Appl. No.: 09/938,317

(22) Filed: Aug. 23, 2001

(65) Prior Publication Data

US 2002/0036904 A1 Mar. 28, 2002

(30) Foreign Application Priority Data

Aug. 25, 2000 (JP) ......................................... 2000-256239

(51) Int. Cl.[7] ............................................... G03B 27/54
(52) U.S. Cl. ........................................... 355/70; 355/67
(58) Field of Search .......................... 353/85; 362/227, 362/234; 355/67, 70, 69, 53

(56) References Cited

U.S. PATENT DOCUMENTS 4,785,192 A * 11/1988 Bruning ...................... 250/548
5,815,248 A    9/1998 Nishi et al. .................... 355/71
5,929,977 A *  7/1999 Ozawa ......................... 355/53
5,985,496 A   11/1999 Nara et al.
6,088,379 A *  7/2000 Owa et al. .................... 372/97
6,193,393 B1 * 2/2001 Dove et al. .................. 362/251

FOREIGN PATENT DOCUMENTS

| JP | 6-349710  | 12/1994 |
| JP | 7-135133  | 5/1995  |
| JP | 9-251208  | 9/1997  |
| JP | 11-195582 | 7/1999  |
| KR | 97-72022  | 11/1997 |

* cited by examiner

Primary Examiner—Russell Adams
Assistant Examiner—D. Ben Esplin
(74) Attorney, Agent, or Firm—Morgan & Finnegan

(57) ABSTRACT

Disclosed is an illumination system which includes a first optical system for combining plural light fluxes from plural light sources and for projecting the plural light fluxes to a surface to be illuminated, a second optical system for separating a portion of one of the combined plural light fluxes, and a first detecting system for detecting the light quantity of the portion separated by the second optical system.

36 Claims, 24 Drawing Sheets

ILLUMINATION SYSTEM WITH PLURAL LIGHT SOURCES, AND EXPOSURE APPARATUS HAVING THE SAME

FIELD OF THE INVENTION AND RELATED ART

This invention relates generally to an illumination system for illuminating the surface to be illuminated, by use of light from plural light sources. More specifically, the invention concerns a method and a structure for controlling the light quantity of an illumination system to be used in a process for exposing a workpiece such as a monocrystal substrate for a semiconductor wafer or a glass substrate for a liquid crystal display (LCD), for example, as well as an illumination system and an exposure apparatus having such structure. The present invention is suitably applicable to a control system for an illumination system to be used in a projection exposure apparatus, for example, in which a glass substrate for an LCD is exposed by a scan method in a photolithographic process by use of plural light sources. However, the applicability of the present invention is not limited to such exposure apparatus, and it can be applied widely to photolithography, projection inspection, projectors and so on.

The scan method mentioned above is an exposure method in which an illumination optical system for illuminating a mark or a reticle (hereinafter, mask) and a projection optical system disposed between the mask and a workpiece, such as a wafer being coated with a resist, are used and in which a portion of a pattern is projected by the projection optical system onto the resist while the mask and the workpiece are scanningly moved in synchronism with each other, relative to the projection optical system, whereby the whole pattern is transferred to the workpiece.

Generally, projection exposure apparatuses have an illumination optical system for illuminating a mask, and a projection optical system disposed between the mask and a workpiece. In order to obtain a uniform illumination region, in such illumination optical system, the light from a light source is introduced into an optical integrator (hereinafter, referred also to "integrator") such as a fly's eye lens, and, while using the light exit surface of the integrator as a secondary light source surface, a condenser lens illuminates the mask surface.

In projection exposure apparatuses, it is desired to increase the light quantity (or an exposure illuminance) of an illumination optical system to thereby improve the throughput. A generally adopted method therefore is enlargement of the output power of a high-pressure halogen lamp which is a light source of the illumination optical system. In the first half 1980s, those lamps of a few hundred watts (W) to 2.0 kW were used. In the first half of 1990s, lamps of 3 kW were developed and, in the second half of 1990s, lamps of 5 kW were developed. Development of higher power lamps still continues.

However, since use of a higher power lamp causes increases in size and cost of the illumination system, proposals have been made recently to use plural light sources and to combine light fluxes emitted from the light sources. For example, Japanese Laid-Open Patent Application, Laid-Open No. 349710/1994 (U.S. Pat. No. 5,815,248) and Japanese Laid-Open Patent Application, Laid-Open No. 135133/1995 (U.S. Pat. No. 5,815,248) show an exposure apparatus of san projection type, having two light sources, comprising a tilted lamp and an elliptical mirror. In these documents, light fluxes emitted from the light sources are introduced into a fly's eye lens and are combined with each other there.

Where the light quantities of these light sources are controlled and if the structure is arranged so that, when any one of the light sources is out of order, the light quantity is compensated by the output of the other light source, it applies a large burden. In Japanese Laid-Open Patent Application, Laid-Open No. 349710/1994, there is a checking sensor for exposure control which is disposed at the back of each elliptical mirror. The checking sensor comprises a light receiving element for receiving leakage light from the elliptical mirror, and a timer for integrating the time during a period in which a photoelectrically converted signal from the light receiving element is higher than a predetermined level. The checking sensor functions to control the replacement timing of the light source and also to discriminate the number of light sources being turned on. The exposure control is made thereby so that, when a single light source is turned on, the scan speed is made a half of that where two light source are turned on. In Japanese Laid-Open Patent Application, Laid-Open No. 135133/1995, a half mirror is disposed obliquely, with respect to the light path, before the light fluxes emitted from the lamps are collected by an elliptical mirror. A light receiving element is disposed at the point of convergence of the light divided by the half mirror. The result of detection thereby (i.e., monitor signal) is used to control the light quantities of the lamps.

However, these conventional illumination systems using plural light sources involves a problem that high precision light quantity control is unattainable. The image quality of a pattern transferred to a workpiece is largely influenced by the performance of the illumination system, for example, the illuminance distribution upon the mask surface or the wafer surface. For this reason, an exposure apparatus having such illumination system as described above is unable to accomplish high precision exposure amount control. As a result, the pattern transfer to a resist is insufficient, and production of high quality semiconductor wafers, LCDs, thin film magnetic heads, etc., is unattainable. Particularly, where a light source (halogen lamp) having a lifetime of about 1,000 hours is replaced by a new halogen lamp, during a few ten hours in the initial stage of operation, consumption of lamp electrodes is large and also the luminance varies largely. During such period in which the lamp electrode consumption is large, it has been found that there is an error of a few percents produced between the light quantity as can be measured by the light receiving element of Japanese Laid-Open Patent Application, Laid-Open No. 135133/1995 and the quantity of light projected to the mask surface where uniform illumination is performed.

According to the investigations about this phenomenon, made by the inventors of the subject application, it has been found that, in the structure of this document, the sensor is disposed near the light source and, consequently, the light quantity of each light source is not controlled on the basis of the light quantity which the workpiece actually receives, in spite of that for precise exposure amount control the light quantity which a workpiece actually receives should be detected and the light quantities (or illuminances) of the plural light sources should be feedback-controlled on the basis of the detection result (i.e., monitor signal).

SUMMARY OF THE INVENTION

It is accordingly an object of the present invention to provide a unique and useful illumination system and an exposure apparatus having such illumination system.

It is another object of the present invention to provide an illumination system in which plural light sources are used and light fluxes emitted from plural light sources are combined for illumination, and in which the light quantities of these light sources are measured very precisely.

It is a further object of the present invention to provide an illumination control system and an illumination control method for such illumination system described above.

It is a further object of the present invention to produce high quality devices such as semiconductors, LDCs, CCDs, thin film magnetic heads, etc., on the basis of high precision exposure amount control using such illumination system as described above.

In accordance with an aspect of the present invention, there is provided an illumination system, comprising: a first optical system for combining plural light fluxes from plural light sources and for projecting the plural light fluxes to a surface to be illuminated; a second optical system for separating a portion of one of the combined plural light fluxes; and a first detecting system for detecting the light quantity of the portion separated by said second optical system.

In accordance with another aspect of the present invention, there is provided an illumination system wherein the surface to be illuminated and a light receiving surface of said first detecting system are placed in an optically conjugate relationship.

In accordance with a further aspect of the present invention, there is provided an exposure apparatus for illuminating a reticle or a mask by use of an illumination system as recited above, and for exposing a workpiece with a pattern formed on the surface being illuminated. In this exposure apparatus, there may be a third optical system for projecting the pattern of the reticle or the mask onto a workpiece, wherein the workpiece comprises a glass plate for an LCD, and wherein the pattern is transferred to the workpiece through a scan of the reticle or the mask and the workpiece.

In accordance with a yet further aspect of the present invention, there is provided a control system, comprising: an optical system for separating a portion of one of plural light fluxes emitted from plural light sources and being separatably combined; detecting means for detecting the light quantity of the portion of the one light flux separated; and control means for controlling the light quantity of one of the plural light sources corresponding to the one light flux, on the basis of the detection by said detecting means. With this control system, the light quantity of the corresponding light source can be controlled very precisely on the basis of the light quantity of one light flux as separated by the optical system.

In accordance with a still further aspect of the present invention, there is provided an illumination method, comprising the steps of: discriminating whether a first light quantity, of a first light flux separated from plural light fluxes which are emitted from plural light sources, including a first light source for emitting the first light flux, and which are being separatably combined, is within a first target range; and controlling the output of said first light source, when it is concluded that the first light quantity is outside the first target range, so that the first light quantity is kept within the first target range. With this method, the first light flux is separated from the combination with the second light flux and is detected. The output of the first light source is controlled on the basis of the detection.

In accordance with a still further aspect of the present invention, there is provided a device manufacturing method, comprising the steps of: exposing a workpiece by use of an illumination light flux controlled in accordance with an illumination method as recited above; and performing a predetermined process to the exposed workpiece. The device manufacturing method can provide the same function as of the illumination control method described above. The scope of the method extends to intermediate and final products, that is, devices which may be, for example, semiconductor chips (such as LSI or VLSI), CCDs, LCDs, magnetic sensors, thin film magnetic heads, etc.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
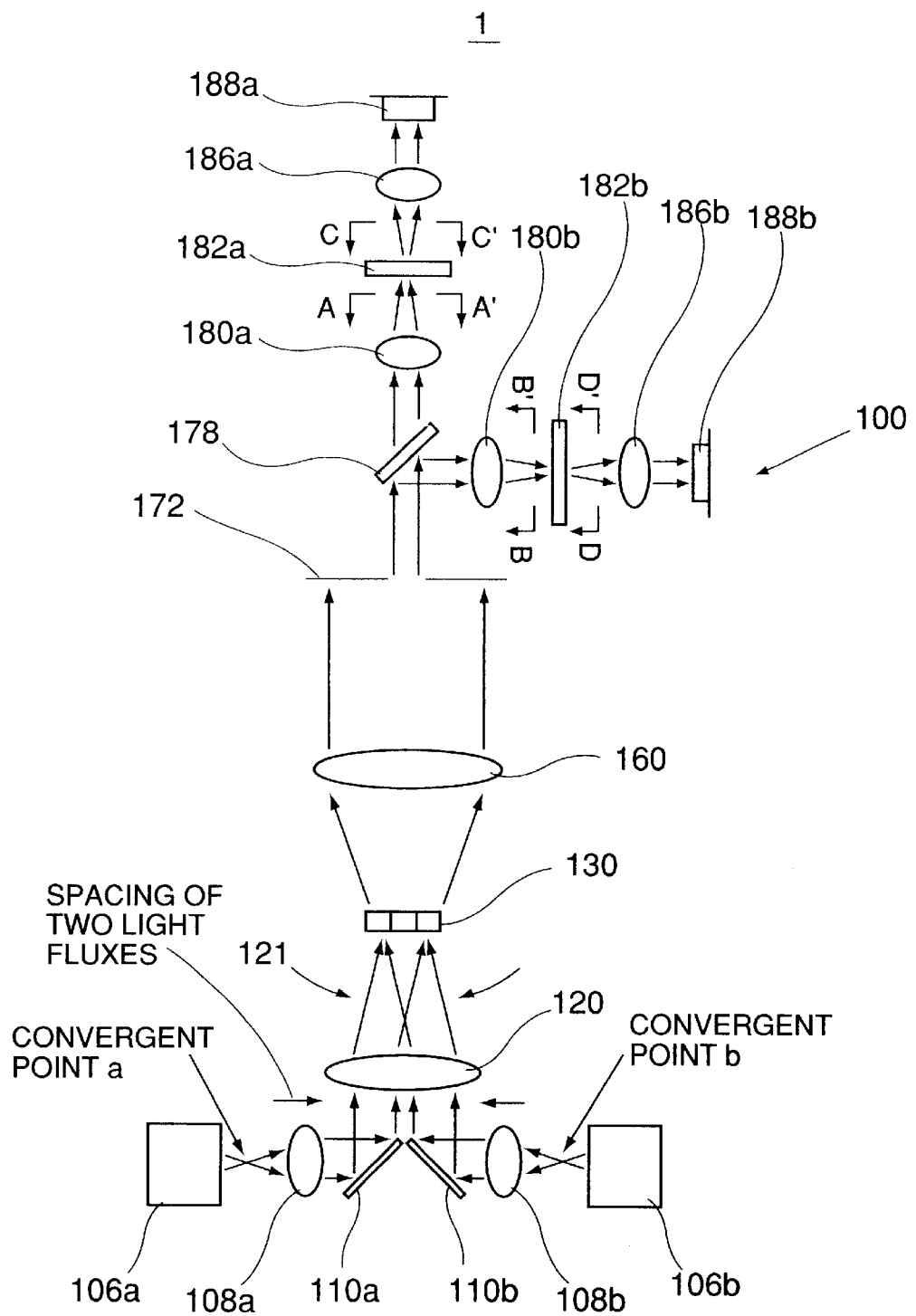
FIG. 1 is a schematic view for explaining light paths in an exposure apparatus and an illumination system thereof, according to an embodiment of the present invention.

Referring to the drawings, embodiments of exposure apparatuses 1 and illumination systems 100 according to the present invention will be described. In the drawings, the same reference numerals are assigned to corresponding elements. Where the same or similar components are illustrated, they are distinguished by use of small-character alphabets. For convenience, a reference numeral without an alphabetic suffix is used to inclusively denote those elements having like reference numerals with alphabetical suffixes.

Figure 2:
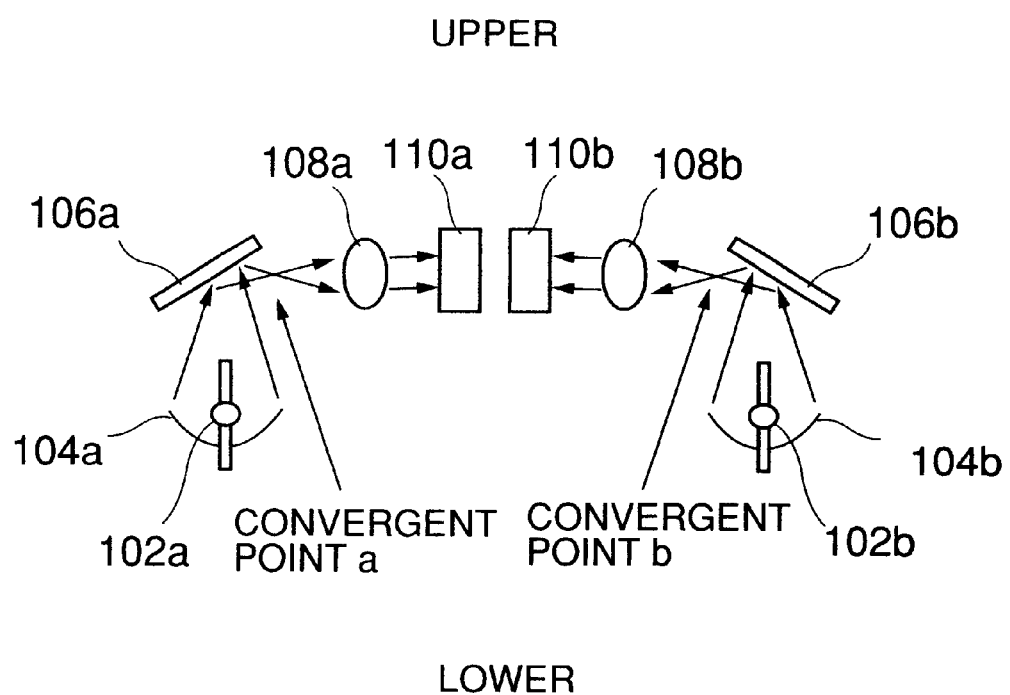
FIG. 2 is a rear view of the exposure apparatus and the illumination system of FIG. 1 embodiment.
Figure 3:
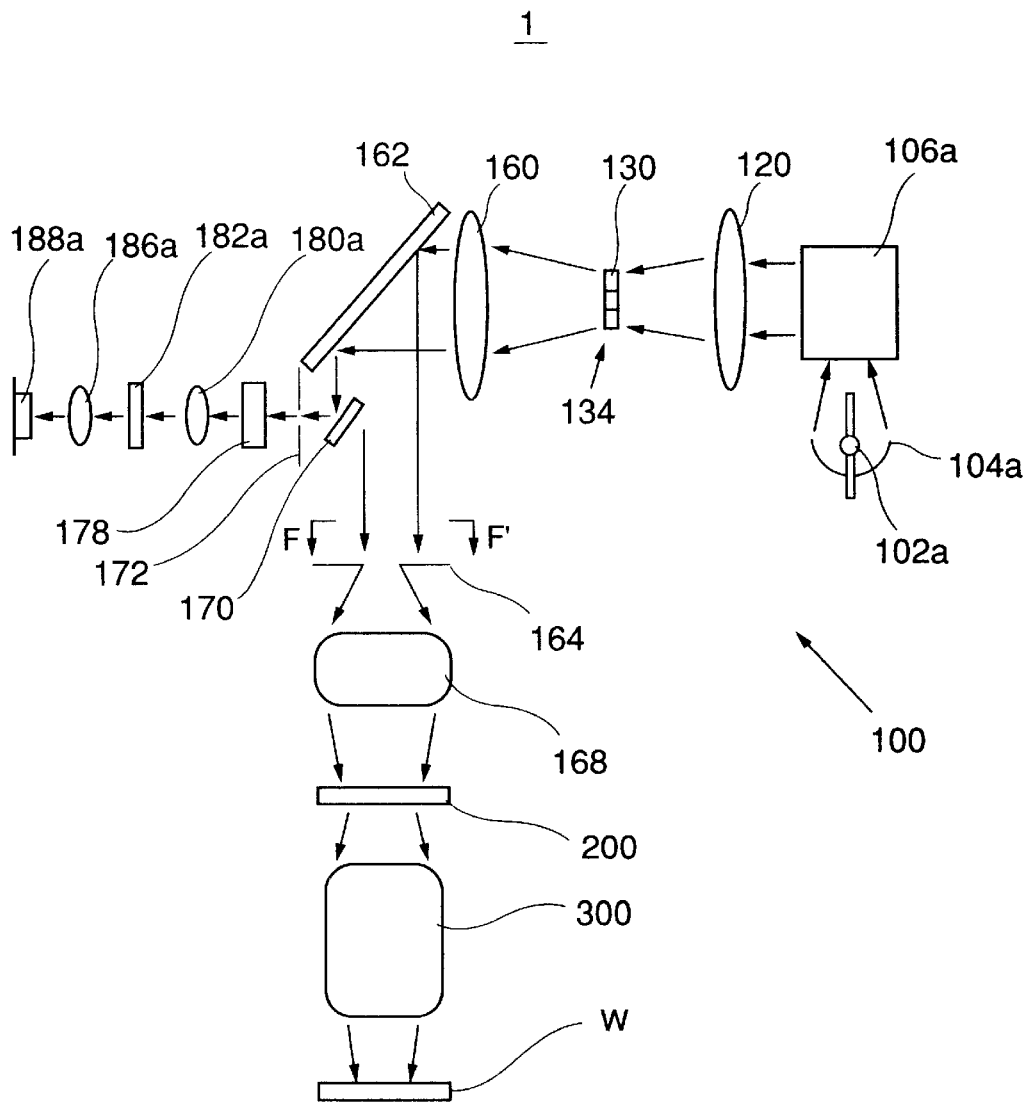
FIG. 3 is a schematic view of light paths in the exposure apparatus and the illumination system of the FIG. 1 embodiment.
Figure 4:
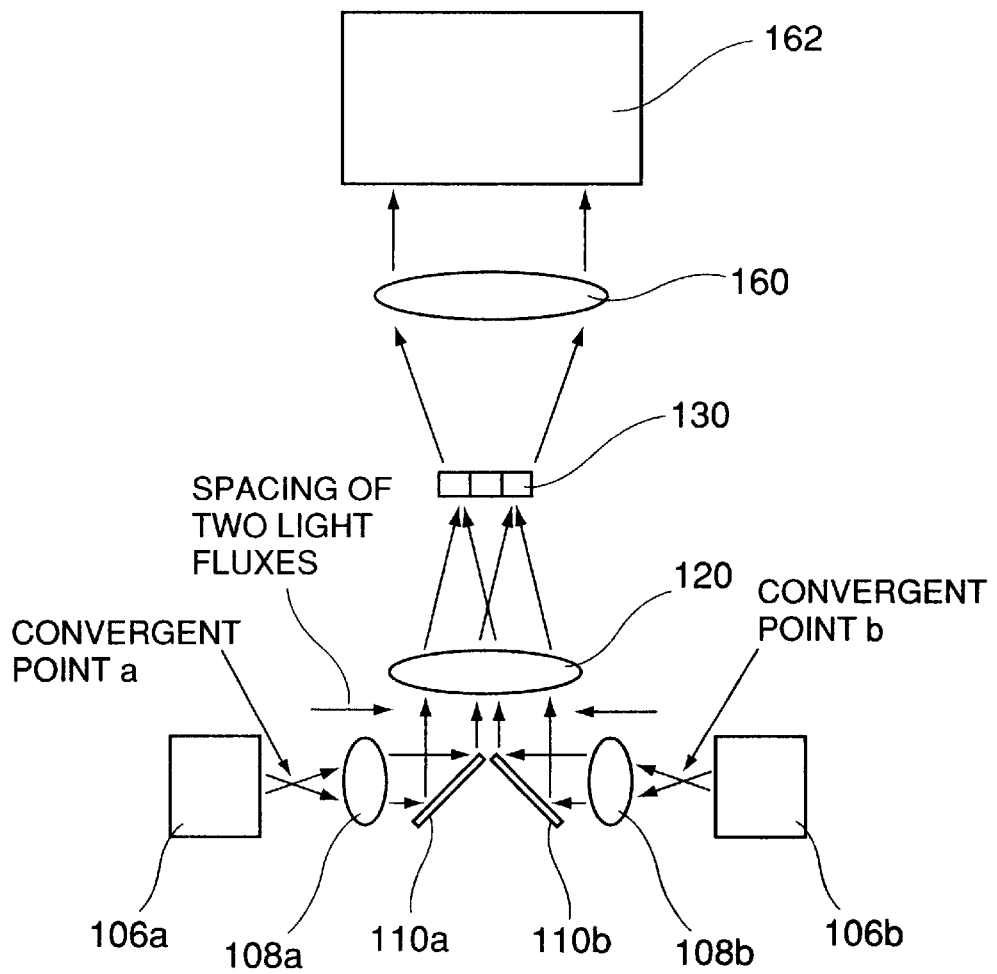
FIG. 4 is a top plan view of the illumination system of the FIG. 1 embodiment.

FIG. 1 is a schematic view for explaining optical paths in an illumination system 100 used in an exposure apparatus 1, according to an embodiment of the present invention, wherein a deflecting mirror 162 and so on are not illustrated. FIG. 2 is a fragmentary rear view of the illumination system 100 of the FIG. 1. FIG. 3 is a schematic view of light paths in the exposure apparatus 1 having the illumination system 100 of FIG. 1. FIG. 4 is a top plan view of the exposure apparatus 1 of FIG. 1.

As best seen in FIG. 3, the exposure apparatus 1 has an illumination system 100, a mask 200 and a projection optical system 300. The exposure apparatus 100 is a projection exposure apparatus for printing, by exposure, a pattern formed on the mask 200 upon a plate W.

The illumination system 100 illuminates the mask 200 on which a pattern to be transferred is formed. As shown in FIGS. 1 and 2, the illumination system 100 comprises two lamps 102a and 102b as light sources, a combining optical system to be described later, a separating optical system also to be described later, sensors 188a and 188b, and a control system.

Each lamp 102 comprises a light emitting tube for producing illumination light, and it extends in a lengthwise direction of lens elements 132 which constitute a fly's eye lens 130 to be described later. Although this embodiment uses two lamps, the present invention is not limited to use of two light sources, as will be described later with reference to FIGS. 9 and 10. The lamp 102 is a high power lamp, and it is kept turned on while being held in a vertically position for stable light emission. For example, the lamp 102 may comprise a super high pressure Hg lamp or a xenon lamp having an output power of 500 W or more.

The light source is not limited to a lamp. The lamp 102 may be replaced by a laser such as an ArF excimer laser of a wavelength of about 193 nm, or a KrF excimer laser of a wavelength of about 248 nm. Where a laser is used, preferably there may be a beam shaping optical system for transforming parallel light from the laser into a desired beam shape, and an incoherency-transforming optical system for converting the coherent laser beam into an incoherent light beam.

The beam shaping optical system may comprise plural cylindrical lenses or a beam expander, for example, for changing the aspect ratio in size of the sectional shape of the laser beam to a desired value. The incoherency-transforming optical system may comprise, for example, an optical system having at least one light returning system such as disclosed in FIG. 1 in Japanese Laid-Open Patent Application, Laid-Open No. 215930/1991, wherein input light is divided at a light dividing surface into at least two light fluxes (e.g., p-polarized light and s-polarized light), wherein an optical path difference greater than the coherence length of the laser light is applied to one of the divided light fluxes, relative to the other, and wherein the one light flux is directed back to the light dividing surface to be combined with the other light flux.

The combining optical system is an optical system for combining two light fluxes emitted from the two light sources 102 toward the mask 200, with each other, and for emitting them. It comprises elliptical (reflection) mirrors 104a and 104b, first deflecting mirrors 106a and 106b, first collimator lenses 108a and 108b, second deflecting mirrors 110a and 110b, a second collimator lens 120, for example.

Since the elliptical (reflection) mirror 104 is accommodated in a lamp house, it may be regarded as an integral structure with the lamp 102, as a light source. More specifically, the lamp 102a and the elliptical mirror 104a as well as the lamp 102b and the elliptical mirror 104b are accommodated, respectively, in lamp houses (lamp boxes) made of a shield glass, while the heat can be exhausted therefrom, so that they are spatially isolated from the first deflecting mirrors 106a and 106b. Each lamp house has a dual-wall structure for the safety to prevent operator's burn in inattentive contact occasions, and it comprises a box-like structure having a large sectional area.

Where the lamp 102 is an Hg lamp, it has a light distribution pattern biased to a direction perpendicular to its electrode. Therefore, use of the elliptical mirror 104 is suitable to accomplish efficient illumination. If the lamp 102 is a high-power Hg lamp, its tube diameter is about 10 cm. Therefore, the elliptical mirror 104 may have an outside diameter of about 50 cm. If the elliptical mirror 104 does not have a large diameter, the temperature of the metal base of the lamp 102 rises excessively.

The lamp 102 is disposed so that the light emission point thereof is placed approximately at the first focal point position of the elliptical mirror 104. Each of the elliptical mirrors 104a and 104b serves to form a luminous point image of the lamp 102a or 102b, at the light convergence point a or b adjacent the second focal point position thereof.

Where the lamp 102 is a high-power Hg lamp, the lamp house for accommodating the elliptical mirror 104 should desirably be small as much as possible. To this end, as regards the elliptical mirror 104, one in which the numerical aperture NA of the light to be converged to the light convergence point is 0.25 or more may desirably be used to thereby shorten the distance between the first and second focal points. This makes it possible to reduce the length of the mirror in the optical axis direction.

Where the lamp 102 is a halogen lamp, it has a substantially uniform light distribution pattern in radial directions. Therefore, in place of the elliptical mirror 104, a spherical mirror and a condenser lens having a large NA may be used, to reflect the illumination light toward the condenser lens. Efficient illumination can be accomplished with this structure.

The first and second deflecting mirrors 106 and 110 serve to deflect the light from the vertical direction to the horizontal direction.

The first collimator lens 108 serves to convert the light coming from the first deflecting mirror into an approximately parallel light flux. The second collimator lens 120 has a focal length longer than that of the first collimator lens 108.

As regards the disposition of the first and second collimator lenses 108 and 120, if the focal length of the first collimator lens 108 is f1 and the focal length of the second collimator lens 120 is f2, the following relation exist between them. That is, the first collimator lenses 108a and 108b are disposed so that the light convergence point a or b thereof is placed approximately at the focal length f1 from the light entrance side principal point of the first collimator lens 108a or 108b. Also, the distance between the light exit side principal point of the first collimator lens 108 and the light entrance side principal point of the second collimator lens 120 is set approximate equal to (f1+f2).

Further, a relation $f2 \geq 2 \times f2$ is desirable. Then, the largest NA (numerical aperture) of the first collimator lens 108 at the light entrance side is substantially equal to that of the elliptical mirror 104. The second collimator lens 120 combines light fluxes from the two first collimator lenses 108 at the entrance pupil plane and, to this end, the pupil diameter is approximately twice the pupil diameter of the first collimator lens 108. However, with a relation $f2 \geq 2 \times f2$ satisfied, the light collecting NA 121 at the light exit side of the second collimator lens 120 can also be kept approximately at the same as or smaller than the NA of the first collimator lens 108.

Where the first and second collimator lenses 108 and 120 are structured such as described above, the optical design becomes very easy. Also, the latitude of optical disposition becomes larger, and this is very advantageous in respect to the practical design.

Where two lamp houses are disposed in juxtaposition as described above, the distance between the optical axes of the lamp boxes become large. In consideration of this, the second deflecting mirror 110 is used to deflect the light flux along the horizontal plane, while the light flux being kept as parallel light by the first collimator lens 108. This enables that the two light fluxes from the two lamps 102a and 102b become close to each other as much as possible, although the two lamp houses are kept away from each other. As a result of this, the two light fluxes passed though the first collimator lenses 108a and 108b are deflected by the second deflecting mirrors 110a and 110b, respectively, and they enter the second collimator lens 120 while being kept close to each other.

The second collimator lens 120 serves to convert parallel light into a convergent light flux being converged upon the fly's eye lens 130. When parallel light having no particular anisotropy in its angular distribution is incident on the fly's eye lens 130 which comprises lens elements 132 having a rectangular sectional shape, if the effective light source is defined at the light exit surface 134 (or a plane adjacent thereto), the effective light source distribution there becomes discrete and the exposure resolution is lowered. In consideration of this, the second collimator lens 120 is used to apply an angular distribution to parallel light.

As described above, the distance between the exit side principal point of the first collimator lens 108 and the entrance side principal point of the second collimator lens 120 is set to be approximately equal to (f1+f2). Then, at the position of a distance f2 backwardly from the exit side principal point of the second collimator lens 120, re-imaged images of two luminous point images of the lamps 102a and 102b are converged while being superposed one upon another. By placing the light entrance surface of the fly's eye lens 130 at the position of a distance f2 backwardly from the light exit side principal point of the second collimator lens 120, it is assured that the light from the lamp 102 enters all the lens elements 132 of the fly's eye lens 130.

In this embodiment, the imaging system comprising the first and second collimator lenses 108 and 120 defines a telecentric optical system which is telecentric both on the light entrance side and on the light exit side. With the provision of an optical system being telecentric on the light entrance side, the light flux passed through the first collimator lens 108 is made into an approximately parallel light flux. Therefore, even if the position of the second deflecting mirror 110 shifts in the assembling, the effective diameter required by the mirror does not change largely. As a result, the design latitude for the mirror disposition becomes larger. Further, with the provision of a telecentric optical system being telecentric on the light exit side, the light flux passed through the second collimator lens 120 has such property that, with respect to any of the central and peripheral lens elements 132 of the fly's eye lens 130, the principal rays of the incident light are parallel.

If the optical system is not telecentric on the light exit side, where the central lens elements 132 of the fly's eye lens 130 have an NA approximately equal to that of the incident light (i.e., NA without an eclipse) and where the peripheral lens elements 132 are alike, at the peripheral lens elements 132 there occurs an eclipse of the incident light by an amount corresponding to the tilt of the principal ray there. In order to avoid eclipse of light incident on the fly's eye lens 130 by the lens elements 132 thereof, in regard to the lens elements 132 at the peripheral portion and as compared with the central lens elements 132, the NA must be set large as much as possible by an amount corresponding to the tilt amount of the chief ray of the incident light.

Since the fly's eye lens has a tightly stuffed structure in which lens elements are arrayed continuously without a clearance, it is not possible to optimize the diameter of the lens elements 132 individually. Therefore, both for central lens elements and for peripheral lens elements 132, a tightly stuffed structure has to be made with the same diameter. In consideration of this, the second collimator lens 120 is made telecentric on the light exit side. With this arrangement, all the lens elements 132 of the fly's eye lens 130 can be provided commonly by those lens elements at the central portion, that is, those with a smallest NA that does not cause an eclipse.

The fly's eye lens 130 is an optical system which emits light while converting the angular distribution of the incident light into a positional distribution. The light entrance surface and the light exit surface thereof are in an optical relation of an object plane and a pupil plane (or a pupil plane and an image plane). This relation will be referred to in this specification also as a Fourier transform relation. However, as will be described later, the (optical) integrator usable in the present invention is not limited to a fly's eye lens. While in this embodiment the fly's eye lens 130 comprises a number of lens elements (i.e., small lenses) 132 each having an oblong sectional shape, it is within the scope of the present invention to use lens elements having a circular sectional shape, a quadrangle shape, a hexagonal shape or the like.

Figure 5:
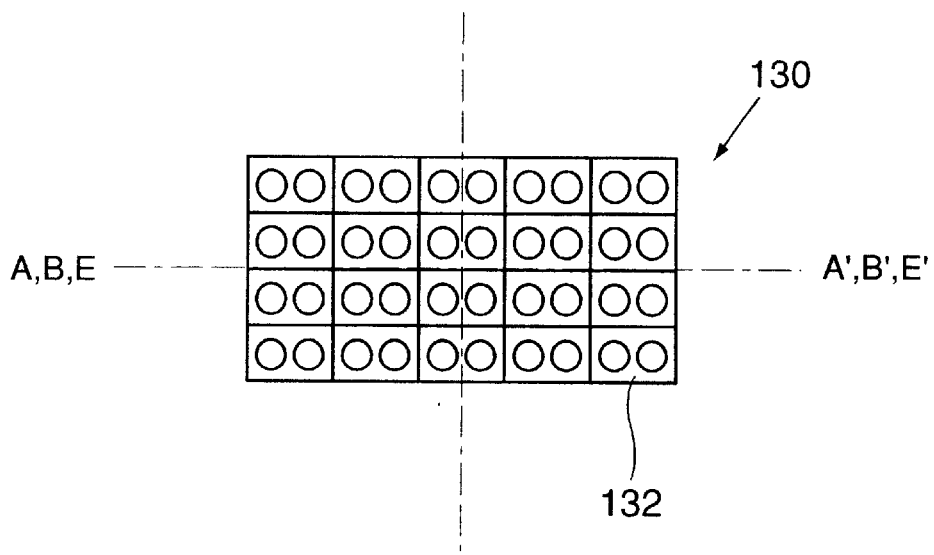
FIG. 5 is a plan view for explaining light sources as viewed from the light exit surface of a fly's eye lens usable in the illumination system of the FIG. 1 embodiment.

As shown in FIG. 5, the fly's eye lens 130 has a structure in which lens elements (or small lens elements) of oblong sectional shape are disposed in four vertical stages (levels) each comprising five rows. Thus, there are twenty lens elements in total. Here, FIG. 5 is a plan view in which the lamp 102 is seen from the exit surface of the fly's eye lens 130. In FIG. 5, small circles at the right hand side of each of the lens elements 132 of the fly's eye lens element 130 correspond to images of the opening of the elliptical mirror 104a (i.e., light emitted from the lamp 102a). Also, small circles at the left hand side correspond to images of the opening of the elliptical mirror 104b (that is, light emitted from the lamp 102b). In this embodiment, as described above, light fluxes from a plural point light sources (effective light sources) defined at or adjacent the light exit surface 134 of the fly's eye lens 130 are directed and superposed one upon another on the mask 200, by means of the condenser lens 120. With this arrangement, the mask 200 as a whole can be illuminated uniformly with a large number of point light sources (effective light sources).

Figure 14:
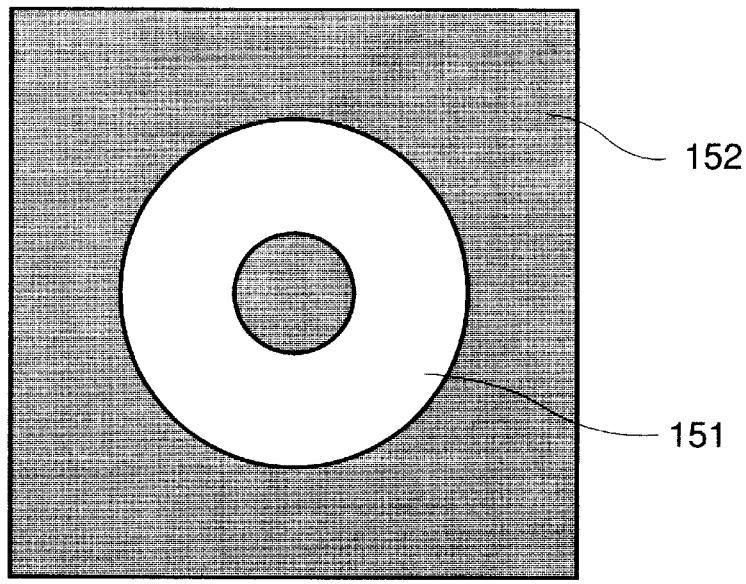
FIG. 14 is a plan view of an aperture stop usable in the illumination system of the FIG. 1 embodiment.
Figure 15:
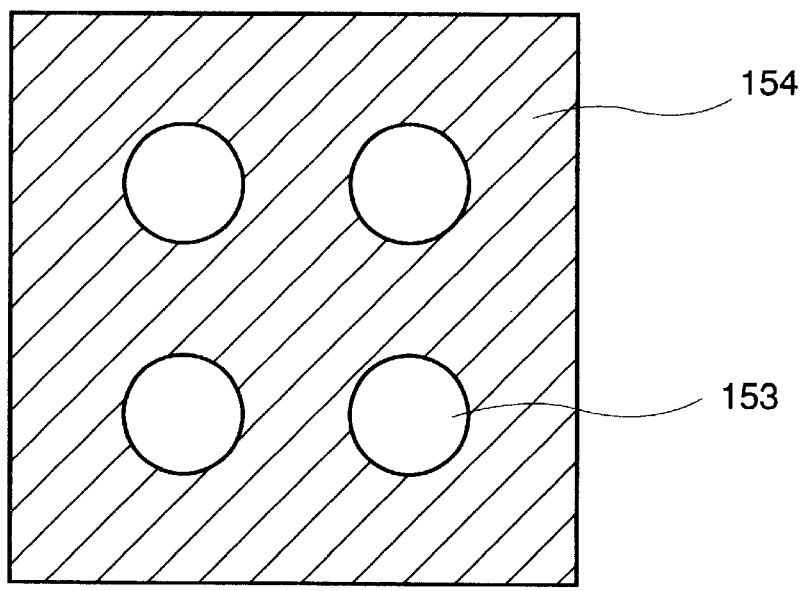
FIG. 15 is a plan view of another aperture stop usable in the illumination system of the FIG. 1 embodiment.

Provided just after the light exit surface 134 of the fly's eye lens 130 is an aperture stop 150 which has a fixed shape and a fixed diameter. Usually, the aperture stop 150 has a circular opening. However, it may have a light transmitting portion 151 and a light blocking portion 152, of ring-like shape, as shown in FIG. 14. Here, FIG. 14 is a plan view of the aperture stop 150. As an alternative, as shown in FIG. 15, the aperture stop 150 may be replaced by an aperture stop 150A having light transmitting portions 153 and a light blocking portion 154. FIG. 15 is a plan view of the aperture stop 150A. The light transmitting portions 153 correspond to portions of ±45 degrees and ±135 degrees of the light transmitting portion 151. These aperture stops 150 and 150A are effective to improve the depth of focus at or near the resolution limit, for exposure of the pattern of the mask 200.

Figure 6:
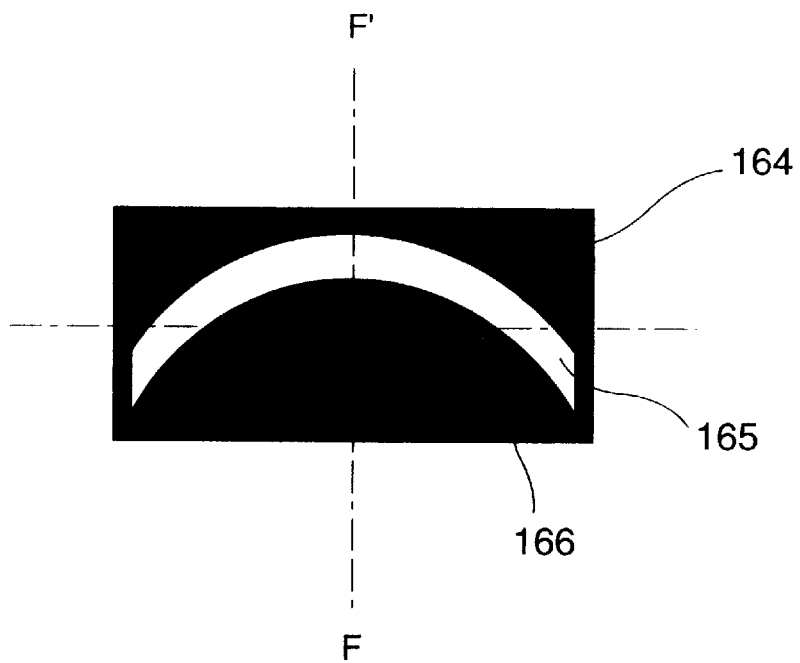
FIG. 6 is a plan view of a slit in the illumination system shown in FIG. 3, as viewed from a direction F–F'.

The condenser lens 160 serves to collect light rays emitted from the fly's eye lens 130 as much as possible and to Koehler illuminate a slit 164 so that the chief rays become parallel to each other (that is, telecentric). More specifically, the slit 164 and the light exit surface 134 of the fly's eye lens 130 are placed in a Fourier transform relation. A deflecting mirror 162 may be disposed at any place between the fly's eye lens 130 and the mask 200. Where the mask 200 is held vertically, the deflecting mirror 162 is unnecessary.

Where the projection optical system 300 comprises a reflection mirror projection system, as shown in FIG. 6 the slit 164 has an arcuate light transmitting portion 165 and a light blocking portion 166 in the region to be illuminated uniformly by the condenser lens 160. Here, FIG. 6 is a plan view of the slit 164 shown in FIG. 3, as viewed from a direction F–F'. Where the projection optical system 300 comprises a lens projection system, the slit has a light transmitting portion of approximately rectangular shape.

The light flux passed through the light transmitting portion 165 of the slit 164 is used as the illumination light for the mask 200. An imaging optical system 168 serves to re-image the image of the opening of the slit 164 upon the mask 200.

Figure 9:
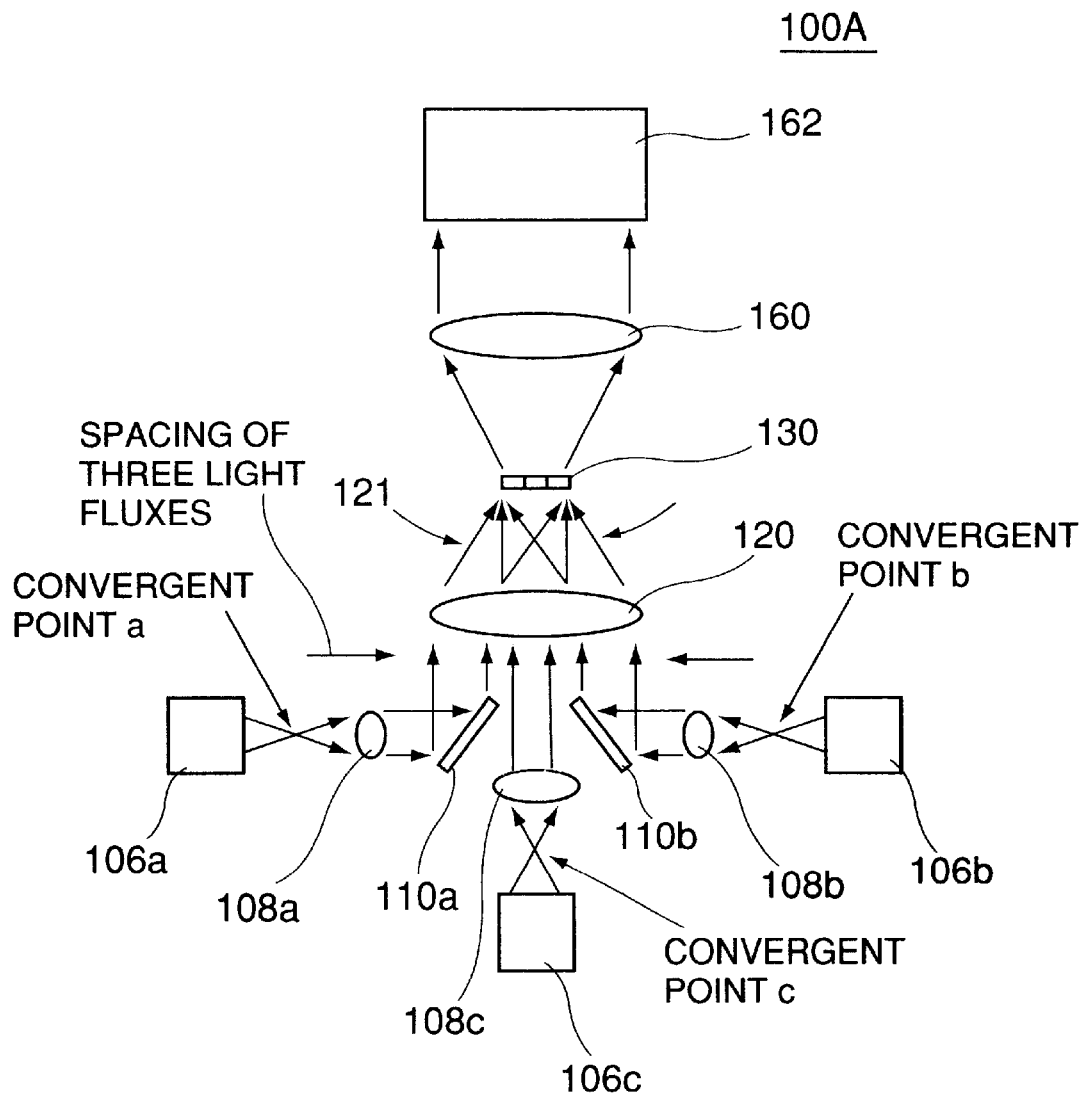
FIG. 9 is a schematic view of light paths in a modified example of the illumination system of the FIG. 1 embodiment.

A portion of the optical system shown in FIG. 1 maybe replaced by the optical system shown in FIG. 9. Here, FIG. 9 illustrates optical paths in the optical system of an illumination system 100A which is a modified example of the illumination system 100 shown in FIG. 1. FIG. 9 is a top plan view of the illumination system 100A in which three light sources are used. In addition to the components shown in FIG. 1, there are a lamp 102c (not shown), an elliptical mirror 104c (not shown) and a first deflecting mirror 106c. In the following, those reference numerals with a capital-letter suffix denote a modification of a component having a reference numeral without a suffix. Also, unless mentioned otherwise, reference numerals without an alphabetic suffix inclusively denote a reference numeral with a capital-letter suffix. In this embodiment, the focal length f1 of the fist collimator lens 108 and the focal length f2 of the second collimator lens 120 are set to satisfy a relation $f2 \geq f1 \times 3$. With this setting, the convergent NA 121 of the second collimator lens 120 also can be made substantially the same as the NA of the first collimator lens 108 or smaller than it.

Figure 10:
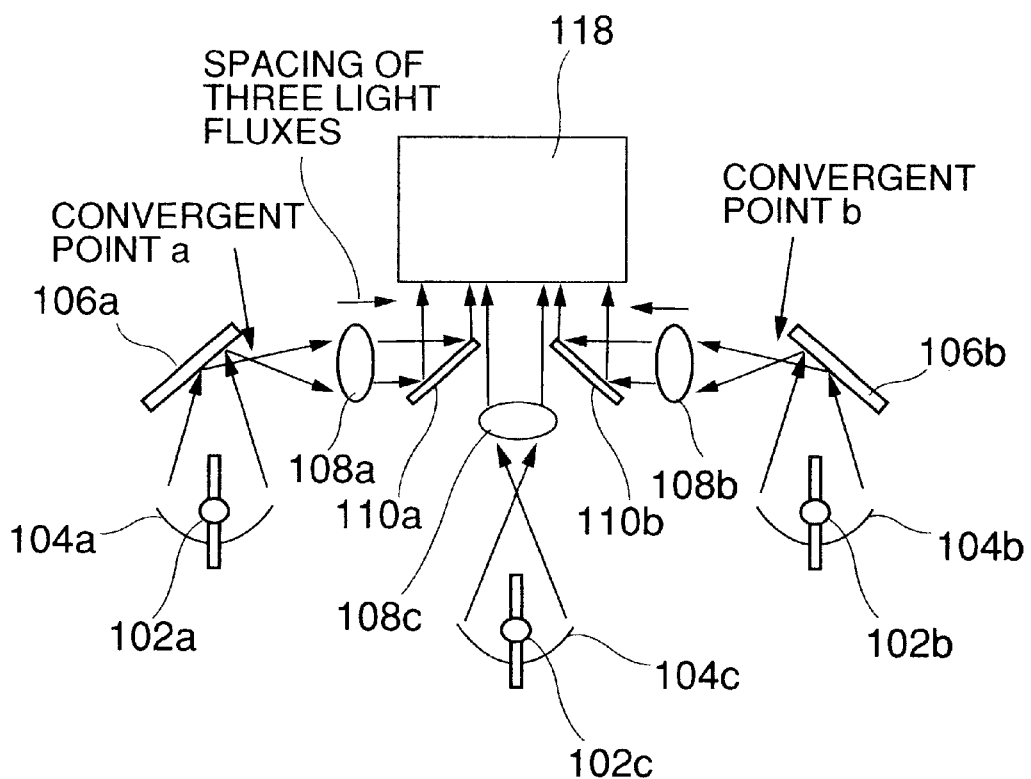
FIG. 10 is a schematic view of light paths, as viewed from the above, in another modified example of the illumination system of the FIG. 1 embodiment.
Figure 11:
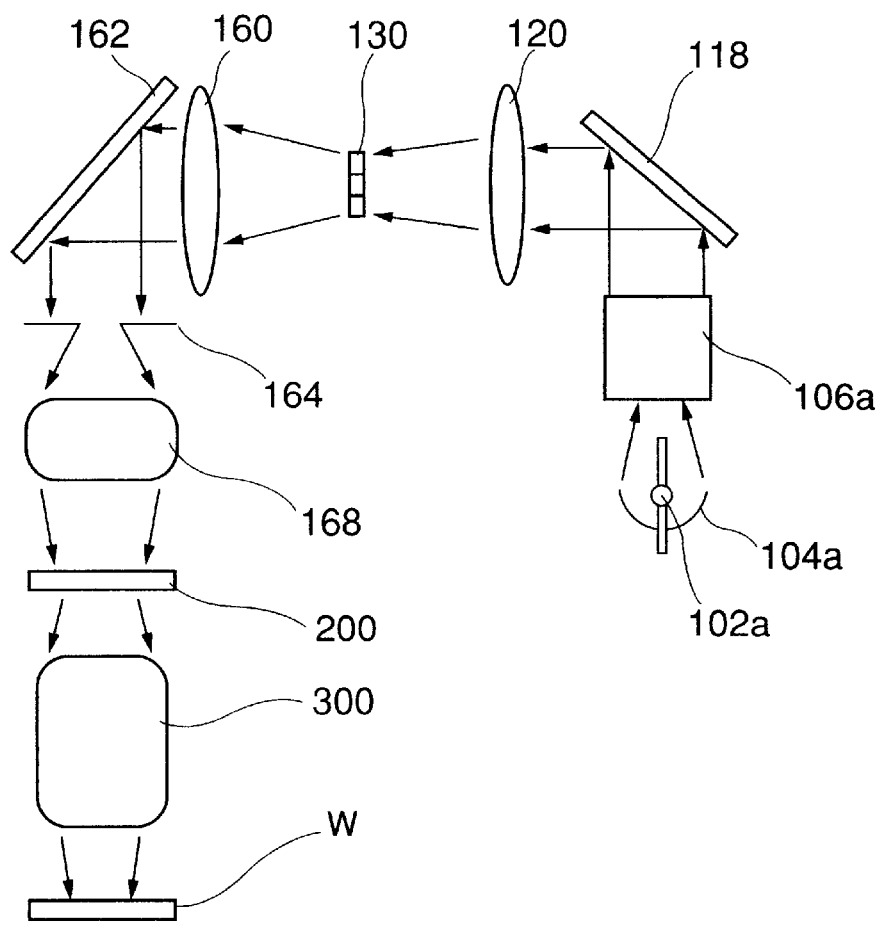
FIG. 11 is a fragmentary side view of the illumination system shown in FIG. 10.

A portion of the optical system shown in FIG. 1 may be replaced by the optical system shown in FIG. 10 or 11. Here, FIG. 10 illustrates optical paths in the optical system of an illumination system 100B which is a modified example of the illumination system 100 shown in FIG. 1. FIG. 10 is a top plan view of the illumination system 100B in which three light sources are used. FIG. 11 is a fragmentary side view of the illumination system 100B.

The illumination system 100B differs from the illumination system 100A of FIG. 9 in the point of presence/absence of deflecting mirrors 106c and 118. As shown in FIG. 10, the light fluxes emitted from the lamps 102a and 102b advance along light paths similar to those of FIG. 9, and they are directed from the second deflecting mirrors 110a and 110b to the deflecting mirror 118. On the other hand, the light flux emitted from the lamp 102c is introduced from the elliptical mirror 104c into the first collimator lens 108c, without intervention of the first deflecting mirror 106c. After this, it is directed to the deflecting mirror 118. As shown in FIG. 11, the deflecting mirror 118 is optically connected to the second collimator lens 120.

In FIGS. 10 and 11, the distance from the first collimator lens 108 to the second collimator lens 120 is larger than that as shown in FIG. 9. Since, however, the light flux is approximately parallel light, the lens diameter of the second collimator lens 120 shown in FIG. 11 may be approximately the same as that shown in FIG. 9.

It will be understood that, as shown in FIGS. 1, 9 and 10, two deflecting mirrors are necessary in the light path from a single lamp. These optical systems are determined from the standpoint of optimization of the layout of the whole apparatus. The reason why such large latitude disposition is enabled is that the light flux emitted from the lamp 102 is collected by the elliptical mirror 104 and, after this, it is converted into an approximately parallel light beam by means of the first collimator lens 108. Here, as regards the diameter of the parallel light, although any diameter can be chosen in accordance with the focal length of the first collimator lens 108, it should be made smaller than the opening diameter of the elliptical mirror 104. If a parabolic surface mirror is used in place of the elliptical mirror 104, an approximately parallel light flux is obtainable. Since, however, it becomes a large parallel light flux having the opening diameter of the parabolic mirror, in order to place the light fluxes from many light sources in juxtaposition with each other, it is necessary to adjust the intervals of them to prevent from becoming excessively large.

Where the optical system shown in FIGS. 1, 10 or 11 is used, the NA of the illumination light can be set at a desired value. Further, the lamp 102 can be disposed so that the direction of elongation of the light emitting tube thereof is set in a desired direction (e.g., the lengthwise direction of the lens elements 132 of the fly's eye lens 130).

Figure 12:
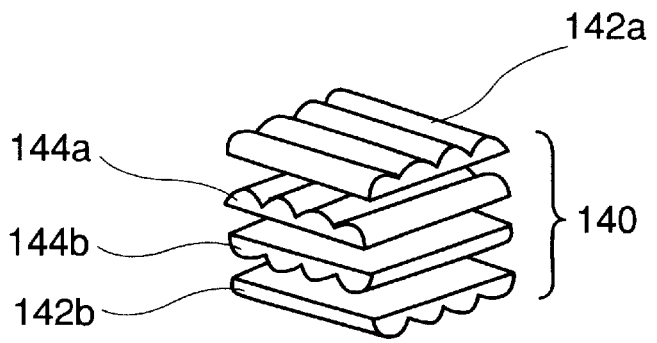
FIG. 12 is an enlarged and perspective view of an alternative integrator, for the fly's eye lens in the illumination system of the FIG. 1 embodiment.

As described hereinbefore, the integrator usable in the present invention is not limited to a fly's eye lens. Referring to FIG. 12, an alternative integrator 140 for the fly's eye lens 130 will be explained. Here, FIG. 12 is an enlarged perspective view of the integrator 140.

The integrator 140 comprises two pairs of cylindrical lens array plates (or lenticular lens plates) 142 and 144, being accumulated. The first and fourth cylindrical lens array plates 142a and 142b have a focal length f3, while the second and third cylindrical lens array plates 144a and 144b have a focal length f4, different from f3. The cylindrical lens plates in the same pair are disposed at the focal point position of the other pair. The two pairs of cylindrical lens array plates 142 and 144 are disposed orthogonally, so that they produce a light flux having different F numbers (="lens focal length"/"effective diameter") in orthogonal directions. As a result of this, a rectangular irradiation region that covers the light transmitting portion 165 is defined on the slit 164, such that effective light quantity utilization is accomplished. It is to be noted here that the number of pairs of the integrators 140 is not limited to two, as a matter of course.

In this embodiment, a plurality of high-power lamps 102 are used to increase the illuminance, the throughput of the projection exposure apparatus can be improved. Further, the optical system after the elliptical mirror 104 can be made compact, such that a projection exposure apparatus with a small footprint is provided. Since light from plural light sources is supplied to the integrator such as the fly's eye lens 130, the uniformness of illuminance upon the mask 200 surface can be kept regardless of the conditions of the light sources. Further, since this embodiment assures large latitude in respect to the structure of the light paths, an illumination system best suited to the layout of the projection exposure apparatus can be accomplished.

The separating optical system serves to separate, from the light fluxes combined by the combining optical system, the light beams corresponding to those from the plural light sources before being combined. In this embodiment, referring to FIG. 1, a case wherein the separating optical system separates two light beams emitted from the two lamps 102a and 102b, will be described. As shown in FIGS. 1 and 3, the separating optical system comprises a deflecting mirror 170, a pinhole member 172, a half mirror 178, lenses 180a and 180b, masks 182a and 182b, and lenses 186a and 186b.

The deflecting mirror 170 serves to divide a light flux which is of the light flux deflected by the deflecting mirror 162 and which is not used for the illumination of the mask 200, and to direct the same toward the pinhole 172. The deflecting mirror 170 is disposed at a position corresponding to the light blocking portion 166 of the slit 164 shown in FIG. 6. The light blocking portion 166 of the slit 164 is a region having a large size such as 100 mm longitudinal and 300 mm lateral, for example, where the exposure apparatus 100 is a projection exposure apparatus for LCD manufacture. On the other hand, the diameter of the light transmitting portion (not shown) of the pinhole 172 for transmitting the light is a few millimeters, at the best. It may be a 0.1 mm diameter or less without any inconvenience, as long as the quantity of light received by sensors 188a and 188b to be described later is enough. For this reason, the deflecting mirror 170 may have a size of about 20 mm diameter, for example. As a result, the deflecting mirror 170 can direct the light to the pinhole 172 without an eclipse in the light flux for illuminating the opening 164. The pinhole 172 is disposed at a position conjugate with the slit 164, with respect to the fly's eye lens 130 and the condenser lens 160.

The half mirror 178 divides the combined light flux. Since in this embodiment the number of the light sources is two, there is a single half mirror 178 to divide the light into two. The number of the half mirror 178 is variable in accordance with the number of the light sources. Lenses 180a and 180b serve to collect light upon the masks 182a and 182b, respectively.

Figure 7:
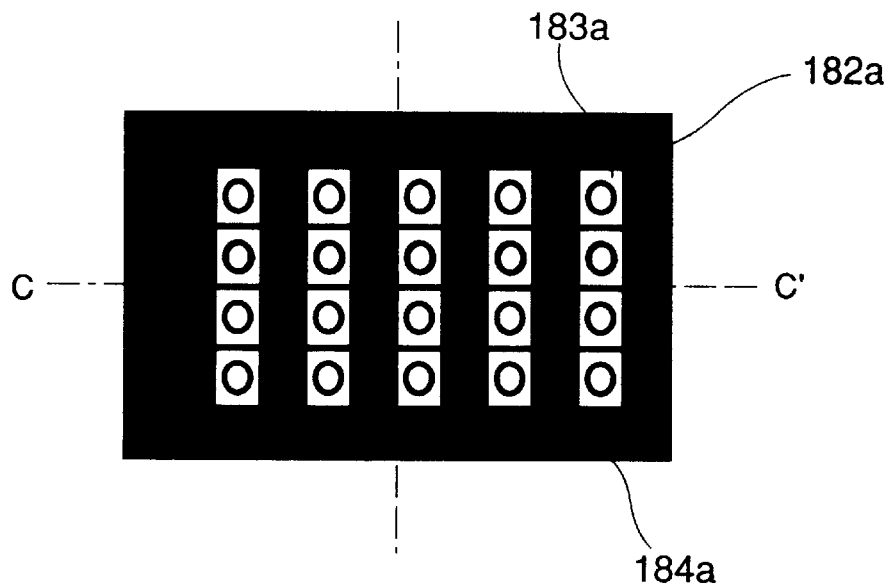
FIG. 7 is a plan view of a mask in the illumination system of FIG. 1, as viewed from a direction C–C'.
Figure 8:
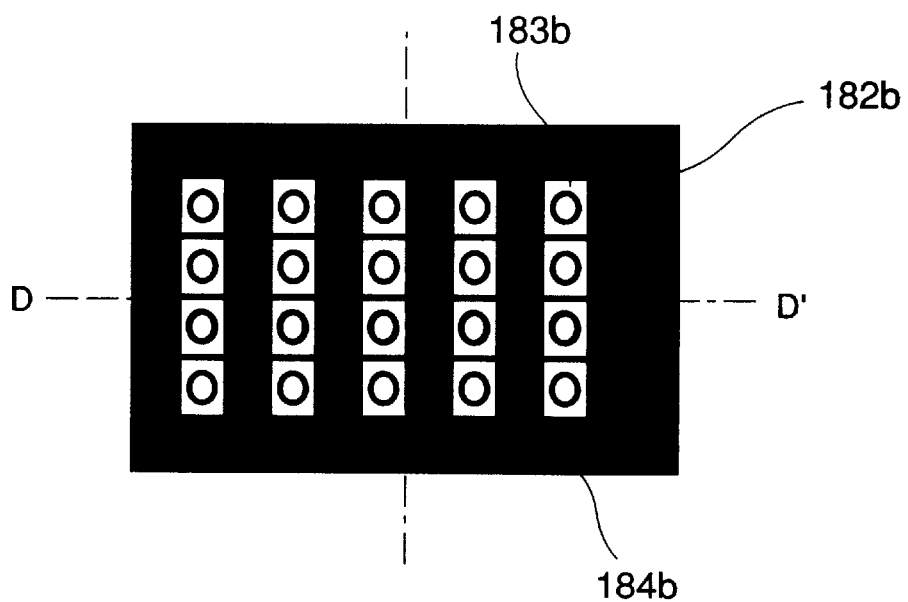
FIG. 8 is a plan view of a mask in the illumination system of FIG. 1, as viewed from a direction D–D'.

As shown in FIG. 7, the mask 182a has stripe-like light transmitting portions 183a longitudinally arrayed in five rows and a light blocking portion 184a. FIG. 7 is a plan view of the mask 182a of FIG. 1 as viewed in a direction C–C'. The light transmitting portions 183a of the mask 182a are defined at the positions effective to transmit right-hand side light fluxes of the lens elements of the fly's eye lens 130 as shown in FIG. 5. Similarly, as shown in FIG. 8, the mask 182b has stripe-like light transmitting portions 183b longitudinally arrayed in five rows and a light blocking portion 184b. FIG. 8 is a plan view of the mask 182b of FIG. 1 as viewed in a direction D–D'. The light transmitting portions 183b of the mask 182b are provided at the positions effective to transmit left-hand side light fluxes of the lens elements 132 of the fly's eye lens 130 as shown in FIG. 5. The light transmitting portions 183 of the mask 182 are defined by vapor deposition of a metal such as chromium or by any other method. The mask 182 is disposed in a conjugate relation with the surface (light entrance surface) of the mask 200 to be illuminated.

Lenses 186a and 186b serve to direct light to sensors 188a and 188b, respectively. These sensors 188a and 188b are optically connected to the separating optical system, to detect the light quantities of the light fluxes as separated by the separating optical system. The sensor 188 may comprise a light quantity detecting circuit of the type well known in the art, such as, for example, a photodiode whose current to voltage characteristic is variable in dependence upon the light quantity. Therefore, detailed description of it is omitted.

In this embodiment, the structure from the pinhole 172 to the sensor 188 is made compact for convenience in practical mounting. For example, if the size of the fly's eye lens 130 (i.e., the diameter of the outside periphery of the five-row and four-stage lens) is about 120 mm×80 mm, the focal length of the lens 180 may be made shorter than the focal length of the condenser lens 160, such that the projection magnification onto the mask 182 is set to a reduction magnification of about 1/10. In that occasion, the size of the image of the fly's eye lens 130 upon the mask 182 (that is, the diameter of the outside periphery of the five-row and four-stage lens) becomes equal to about 12 mm×8 mm. Therefore, as regards the outer diameter of the mask 182, a size of 20 mm×16 mm which is slightly larger than the image of the fly's eye lens 130 may be sufficient. Thus, reduction in size of the mask 182 is attainable.

Further, if the reduction projection magnification is small, the imaging and converging NA upon the mask 182 becomes large. Thus, if the sensor 188 is disposed just after the mask 182, then the photoelectric conversion efficiency is low with a large light incidence angle. The photoelectric conversion efficiency is highest with normal incidence. In consideration of it, a lens 186 is provided between the mask 182 and the sensor 188, to make smaller the converging NA of the light incident on the sensor 188. With this arrangement, the difference in photoelectric conversion efficiency with respect to light, due to the difference in incidence angle on the sensor 188, is made smaller.

Figure 18:
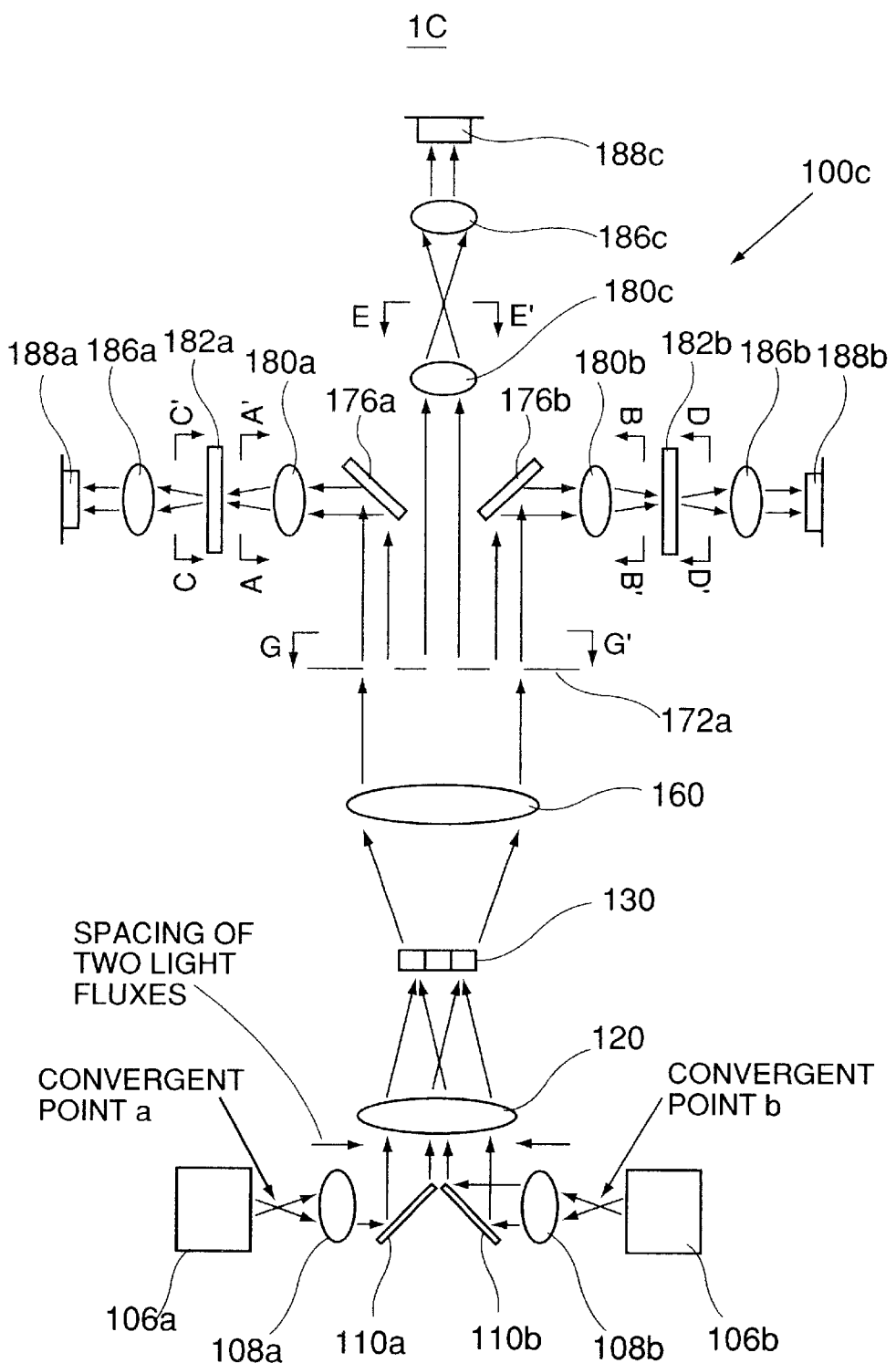
FIG. 18 is a schematic view of light paths in a modified example of the exposure apparatus and the illumination system of the FIG. 1 embodiment.
Figure 19:
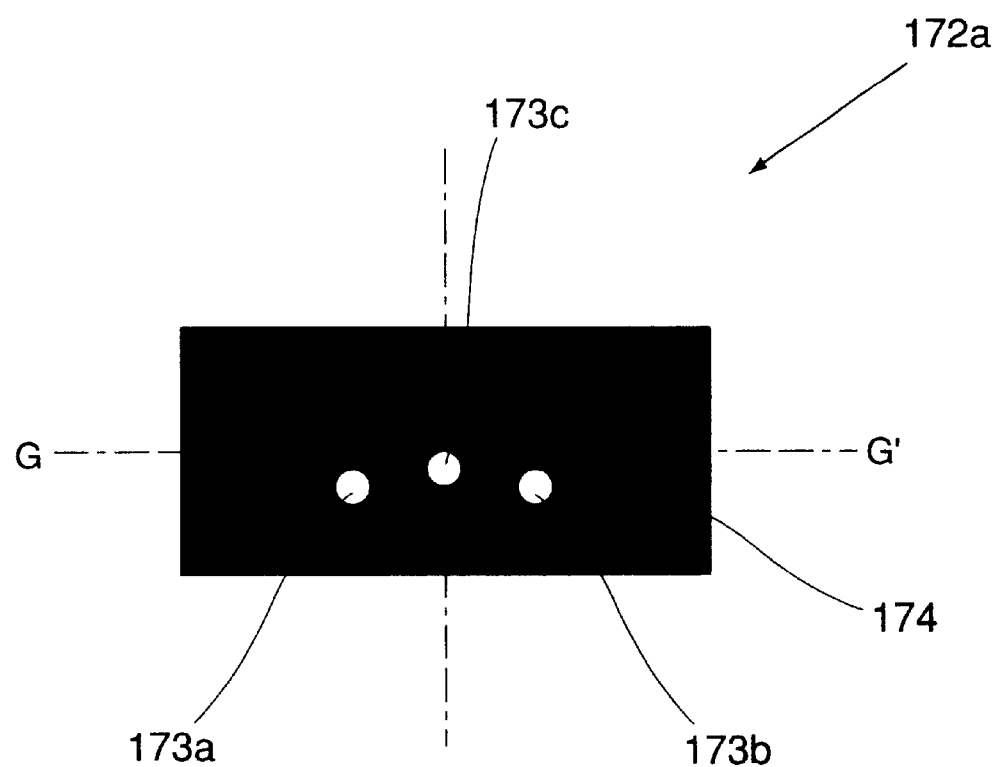
FIG. 19 is a plan view of a pinhole member in the illumination system shown in FIG. 18, as viewed from a direction G–G'.
Figure 20:
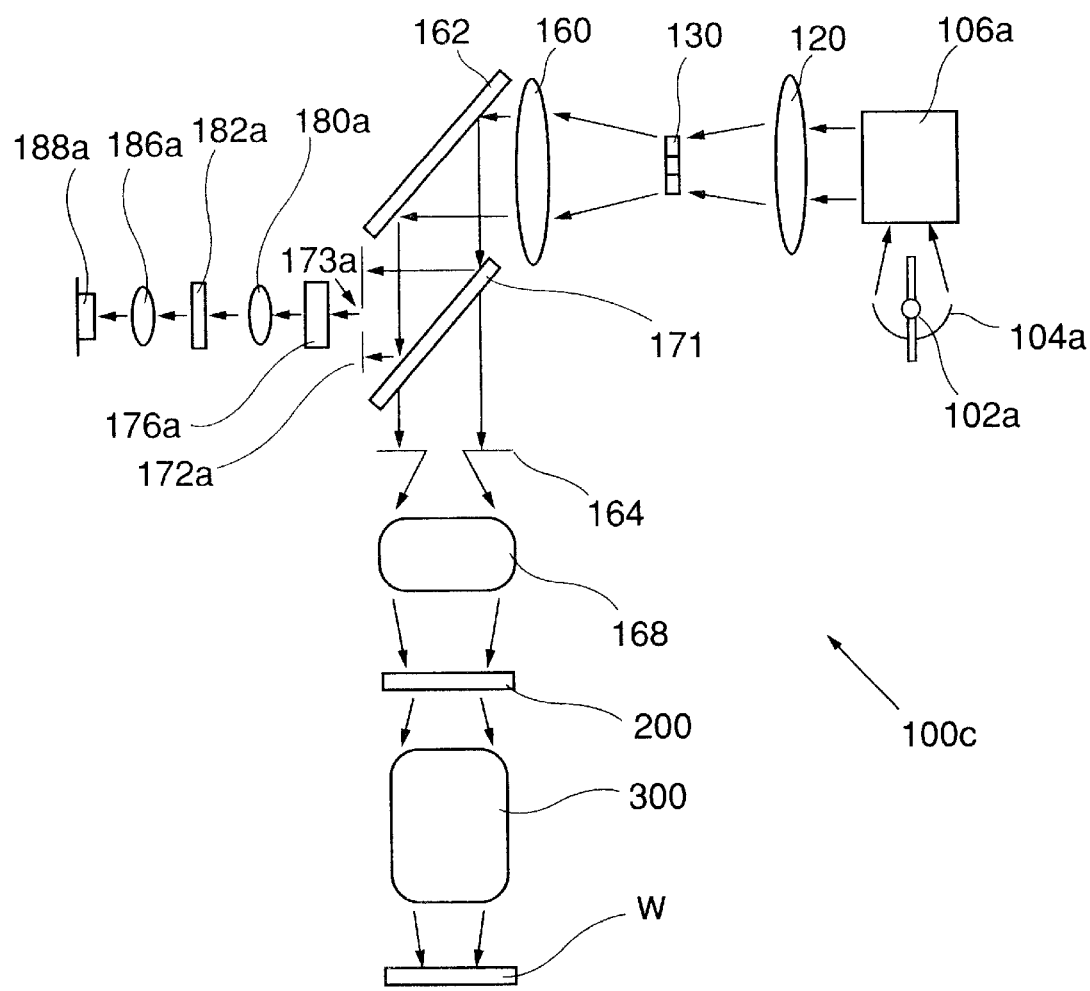
FIG. 20 is a schematic view of light paths in the exposure apparatus shown in FIG. 18.

In an alternative embodiment, as shown in FIGS. 18–20, there may be a system for detecting the quantity of the combined light flux. Here, FIG. 18 is a schematic view of light paths in an exposure apparatus 1C (illumination system 100C) which is a modification of the exposure apparatus 1 of FIG. 1, wherein a deflecting mirror 162 and the like are not illustrated. FIG. 19 is a plan view of a pinhole member 172a, as viewed in a direction G–G' in FIG. 18. FIG. 20 is a schematic view of light paths in the exposure apparatus 1C having an illumination system 100C of FIG. 18. The rear view and the top plan view of the exposure apparatus 1C are similar to those of FIGS. 2 and 4.

The exposure apparatus 1C of this embodiment differs from the exposure apparatus 1 of FIG. 1, in that it has a sensor 188c for detecting the quantity of the combined light flux. The deflecting mirror 171 functions to split the light from the deflecting mirror 162, and to direct it to the pinhole 172a to thereby illuminate the pinhole uniformly.

As an alternative, the deflecting mirror 171 may be a half mirror. The pinhole 172a is provided in place of the pinhole member 172. The deflecting mirror 176 is provided in place of the half mirror 178.

As shown in FIG. 19, the pinhole member 172a has light transmitting portions 173a–173c and a light blocking portion 174. The pinhole 172a may be made of metal, or it may be produced by any method such as vapor deposition of metal such as chromium, for example, upon a glass plate. The light transmitting portions 173a and 173b are at the same level with respect to a line parallel to a line G–G'. The light transmitting portion 173c is at a level higher than the light transmitting portions 173a and 173b. As regards the shape of the deflecting mirror 171, any shape is usable provided that it partially reflects only the light flux impinging on the light transmitting portions 173a–173c. In order to assure that the light flux which reaches the opening 165 of the slit 164 is not blocked, the deflecting mirror 171 is formed with an opening (not shown) corresponding to the opening 165.

As shown in FIG. 20, the light passed through the light transmitting portion 173a of the pinhole 172a is reflected by the deflecting mirror 176a toward the lens 180a. The light passed through the light transmitting portion 173b of the pinhole 172a is reflected by the deflecting mirror 176b toward the lens 180b. Since the optical system following the lens 180 is similar to that of the FIG. 1 embodiment, description thereof is omitted. Anyway, like FIG. 1, the sensor 188a detects the quantity of light emitted from the lamp 102a, while the sensor 188b detects the quantity of light emitted from the lamp 102b.

On the other hand, the light passed through the light transmitting portion 173c of the pinhole 172a is once converged by the lens 180c and, after passing through the lens 186c, it is incident on the sensor 188c.

Alternatively, the light passed through the light transmitting portion 173c may be projected directly upon the sensor 188c. The lenses 180c and 186c function to keep the angle of light incident on the sensor 188c, substantially the same as the angle of light impinging on the sensors 188a and 188b, so that the sensors 188a–188c have substantially the same photoelectric conversion efficiency to the light impinging thereupon.

The sensor 188c functions to exactly detect the illuminance on the mask 200 surface, being illuminated by the combined light fluxes from the two lamps 102a and 102b. Consequently, the result of detection by the sensor 188c is, in principle, equal to the sum of the outputs of the sensors 188a and 188b.

Here, while the sensors 188a and 188b receive light coming through the masks 182a and 182b, the sensor 188c receives the light without such mask. For this reason, during a long term, the result of detection by the sensors 188a and 188b is influenced by any deterioration with lapse of time, whereas the sensor 188c is free from such influence. In other words, there is a possibility that, with the lapse of time, the result of detection by the sensors 188a and 188b deviates from the actual light quantity value as provided on the mask 200 surface by the light from one of the light sources. On the other hand, the result of detection by the sensor 188c continuously corresponds to the actual light quantity value (in terms of the influence of the mask 188).

Figure 13:
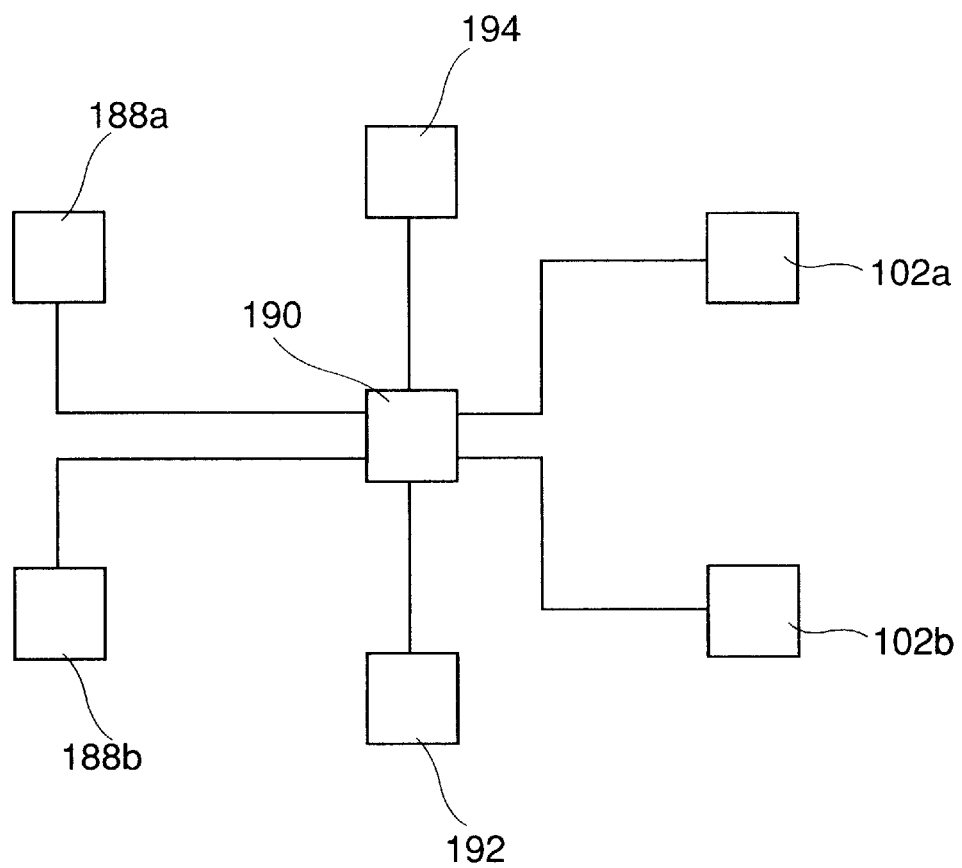
FIG. 13 is a block diagram of a control system for the illumination system of the FIG. 1 embodiment.

The control system functions to control the outputs of the light sources in relation to the present invention. It comprises a control unit 190, a memory 192, and timer means 194. As shown in FIG. 13, the control unit 190 is connected to the lamps 102 and the sensors 188, and it controls the light quantities of the lamps 102 individually on the basis of the detection by the sensors 188. Here, FIG. 13 is a block diagram of the control system of the illumination system 100. The control unit 190 is connected also to the memory 192. In relation to the present invention, the memory 192 functions to store therein the illumination control method to be performed by the control unit 190 and/or the data to be used therefor. The memory 192 may comprise a ROM, a RAM or any other storing means.

In this embodiment, the control unit 190 is a control unit for the illumination system 100. If necessary, it may function as a control unit for the exposure apparatus 1 or for any external unit. Further, the control unit 190 may be controlled by the exposure apparatus 1 or by any external unit. Also, selectively, the control unit 190 is connected to the timer means 194. The timer means 194 may comprise a timer which includes a clock, a clock pulse generator and a counter, or it may comprise a counter connected to a control unit (not shown) of the exposure apparatus 1, for counting the number of exposures. If necessary, the memory and the timer means may be disposed outside the illumination system 100.

In accordance with an aspect of the present invention, where light fluxes from plural light sources are combined with each other, each light flux from a corresponding light source is selectively extracted out of the combined light fluxes, and it is used as a basis for the feedback control to the individual light sources. In other words, in the present invention, while the mask 200 is illuminated with combined light fluxes, the quantity of each light flux projected to the mask 200 is monitored. With this arrangement, in the exposure apparatus 1 of the present invention, through the control of individual light sources the exposure amount control can be performed very precisely, while the illuminance on the mask 200 is kept high. Therefore, high quality devices can be produced.

Next, referring to FIG. 16, an example of an illumination control method using the control unit 190 will be described.

Figure 16:
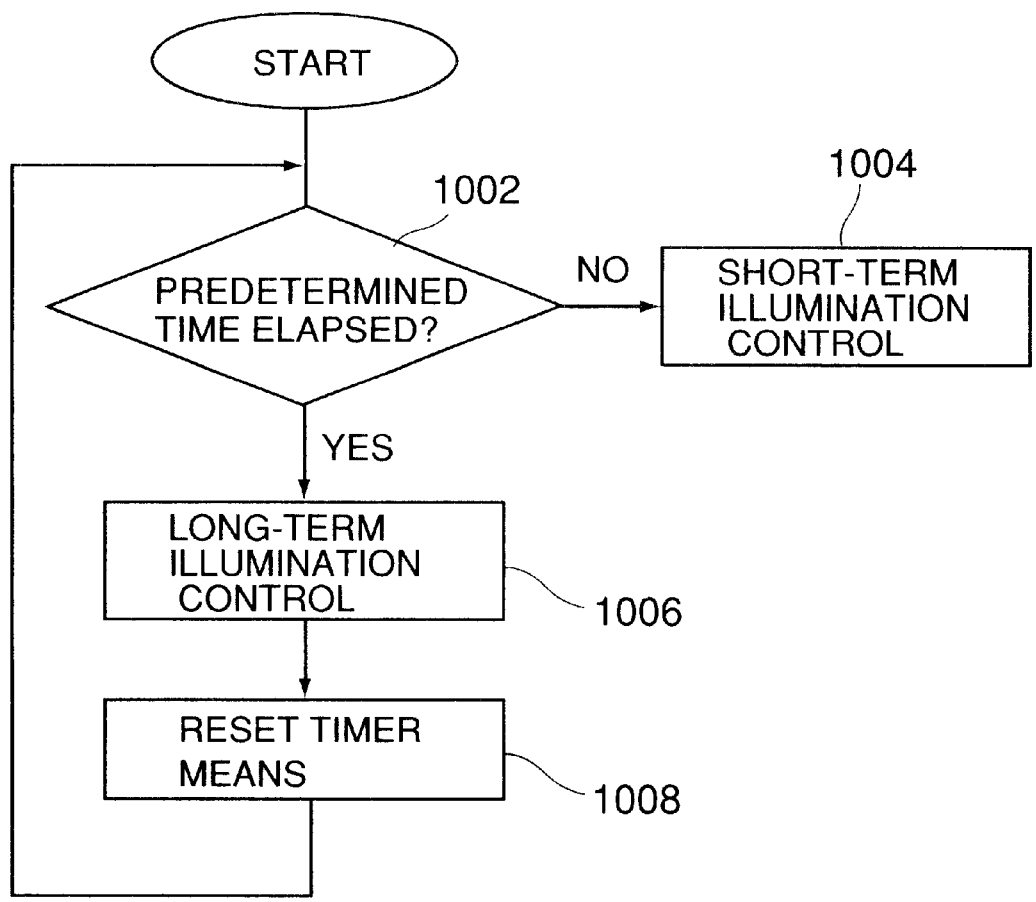
FIG. 16 is a flow chart for explaining an example of an illumination control method to be performed by the control unit of the control system shown in FIG. 13.

FIG. 16 is a block diagram of an example of an illumination control method to be performed by the control unit 190. First, as the control starts, the control unit 190 refers to the timer means 194 and discriminates whether a predetermined period has elapsed or not (step 1002).

The timer means 194 may initiate the time counting simultaneously with the start of the operation, or it may count the number of exposures noticed by the control unit of the exposure apparatus. The control unit 190 discriminates the elapse of the predetermined period on the basis of the time information or counting information as measured by the timer means 194.

The predetermined period may correspond to the time moment whereat continuous exposures for one carrier (25 to 50 liquid crystal plates), the time moment whereat the exposure of a single plate W is completed, a few hours, the time moment for job driving being associated with a certain job, a period set by a console (for example, every two weeks) or any other arbitrary time moment. Further, the long-term illumination control may be completely automated or, alternatively, a portion of it may be performed manually by a service person of the exposure apparatus 1 (or the illumination system 100).

If it is concluded that the predetermined time has not elapsed (step 1002), the control unit 190 performs the short-term illumination control only (step 1004). In the short-term illumination control, the control unit feedback controls the lamps 102 individually under an assumption that the mask 182 has no deterioration. Details of the short-term illumination control will be described later.

If it is concluded that the predetermined time has elapsed (step 1002), the control unit 190 performs long-term illumination control (step 1006). In the long-term illumination control, the control unit 190 controls the illumination while taking into account the deterioration of the mask 182. More specifically, where the light blocking portion 184 of the mask 182 is formed by vapor deposition of metal such as chromium, for example, there is a possibility that chromium changes to chromium oxide having a light transmissivity, with time of an order of a half year to a few years. In consideration of it, the mask 182 may be replaced by a fresh one every predetermined term (e.g., one year). In this embodiment, however, since deterioration of the mask 182 does not directly relate to the quality of illumination of the mask 200 and also from the standpoint of lower cost, periodic replacement of the mask 182 is not carried out and, in place of it, the long-term illumination control is performed. Details of the long-term illumination control will be described later. When the long-term illumination control is finished, the timer means 194 is reset (step 1008). This may be done, for example, in response to a trigger signal which represents the completion of the long-term illumination control.

The present invention is not limited to a case where both the short-term illumination control and the long-term illumination control are performed. Only the short-term illumination control may be done. Namely, steps 1002, 1006 and 1008 are optional. Further, if the timer means 194 has a reset function responsive to measurement of the predetermined time, step 1008 is unnecessary. Moreover, as long as the long-term illumination control 1006 is carried out at predetermined time intervals, steps 1002, 1006 and 1008 are not limited to the flow described above. For example, the long-term illumination control may be initiated as the timer means 194 has counted a number corresponding to a multiple of 20 of the number of exposures.

Figure 17:
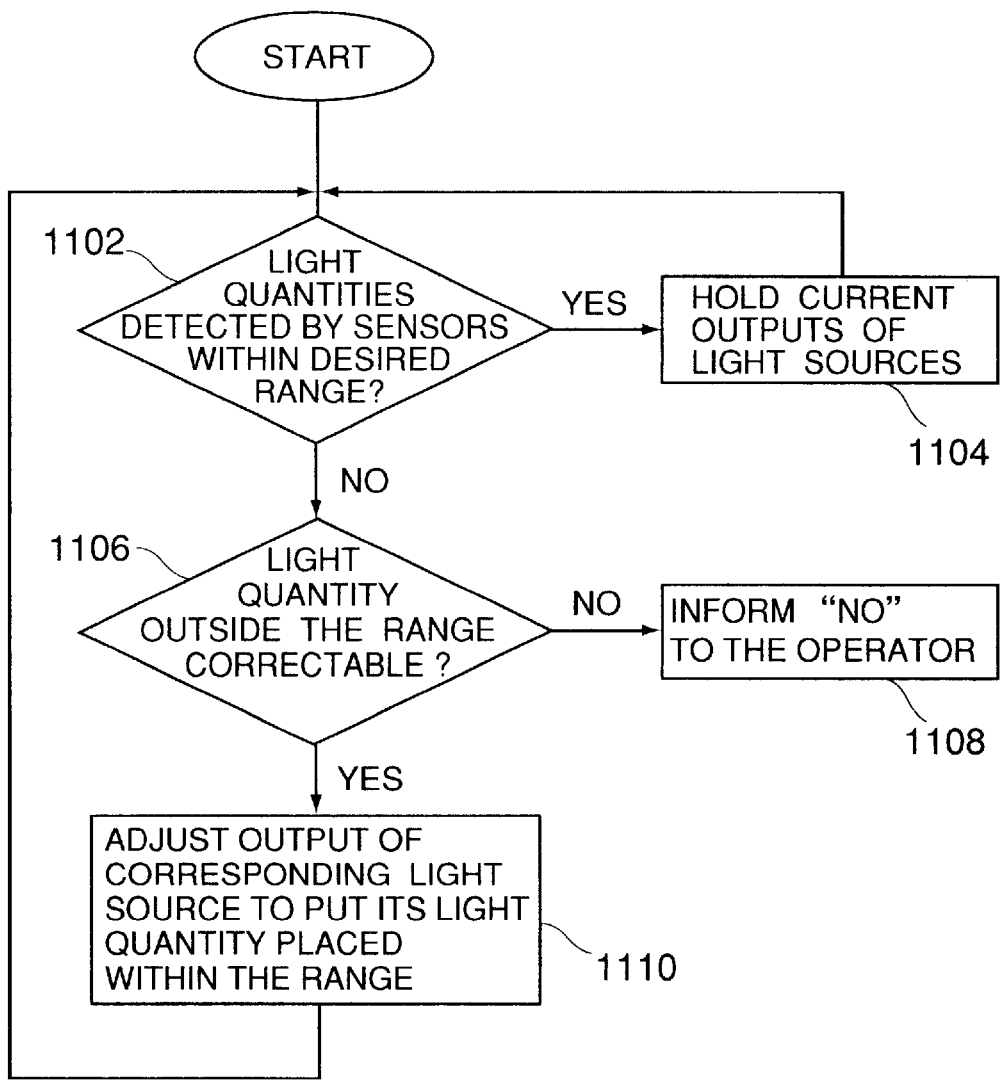
FIG. 17 is a flow chart for explaining short-term illumination control in the illumination control method shown in FIG. 16.

Referring now to FIG. 17, an example of short-term illumination control will be explained. FIG. 17 is a flow chart of an example of short-term illumination control to be performed by the control unit 190. As the control starts, the control unit 190 discriminates whether the light quantities detected by the sensors 188 are within a predetermined target range stored in the memory 192, or whether they satisfy a predetermined target value stored in the memory 192 (step 1102). As described above, the sensor 188a detects the light quantity as the light emitted from the lamp 102a irradiates the surface of the mask 200, and the sensor 188b detects the light quantity as the light emitted from the lamp 102b irradiates the surface of the mask 200. The target range or target value to be stored in the memory 192 can be calculated by simulation.

If it is concluded that the light quantity detected by the sensor 188 is within the target range or satisfies the target value (step 1102), the control unit 190 controls to keep the current output of the lamp 102 (step 1104). As a result of this, uniform illumination on the mask 200 is maintained.

On the other hand, if it is concluded that the light quantity detected by the sensor 188 is outside the target range or does not satisfy the target value (step 1102), the control unit 190 discriminates whether the light quantity is in a correctable range or not (step 1106). The provision of step 1106 (as well as step 1108 to be described) is optional, because if, for example, the lamp 102a does not light due to any disorder, the feedback control at step 1110 (to be described) is not attainable. The control unit 190 may obtain basic information for discrimination at step 1006, directly from the lamp 102, or from a sensor disposed adjacent the lamp 102 to detect any abnormality of the same. The correctable range is similarly stored in the memory 192, and it can be calculated by simulation.

If the light quantity outside the target range or not satisfying the target value is concluded as being not in a correctable range (step 1106), the control unit 190 informs the result to the operator of the illumination system 100 or the exposure apparatus 1. This can be done by turning an alarm lamp on, or by ringing an alarm sound, for example. If necessary, the control unit 190 informs the result while turning off another lamp, not out of order, and discontinuing the process.

If the light quantity outside the target range or not satisfying the target value is concluded as being in a correctable range (step 1106), the control unit 190 adjusts the output of the corresponding lamp 102 in order that the light quantity comes within the target range or satisfies the target value (step 1110). More specifically, the control unit 190 controls the driving current and the driving voltage of the lamp 102, for example, by use of a driving circuit (not shown). Step 1101 feedbacks to step 1102.

In accordance with the short-term illumination control method shown in FIG. 17, each lamp 102 is feedback controlled individually by the control unit 190, by which the illuminance on the mask 200 surface can be kept constant. More specifically, the control unit 190 performs feedback control to the lamp 102a (through a driving system therefore) on the basis of an output signal of the sensor 182a which receives light from the lamp 102a only, thereby to maintain the illuminance of illumination light upon the mask 200 constant. Also, the control unit 190 performs a similar control to the lamp 102b, like the lamp 102a. Since the sensor 182 is disposed at a position conjugate with the surface of the mask 200 to be illuminated, the sensor can measure the actual light quantity as the light emitted from the lamp 102 irradiates the mask 200. Therefore, the reliability is high as compared with conventional systems in which a sensor measures light at a position irrelevant to the mask surface.

As an example of the long-term illumination control 1006 in the structure of the optical system shown in FIG. 1, data concerning deterioration of the mask 182 with respect to time may be stored in the memory 192, and the target range or target value may be corrected with elapse of time. The data for deterioration of the mask 182 with respect to time is obtainable by simulation, for example.

Figure 21:
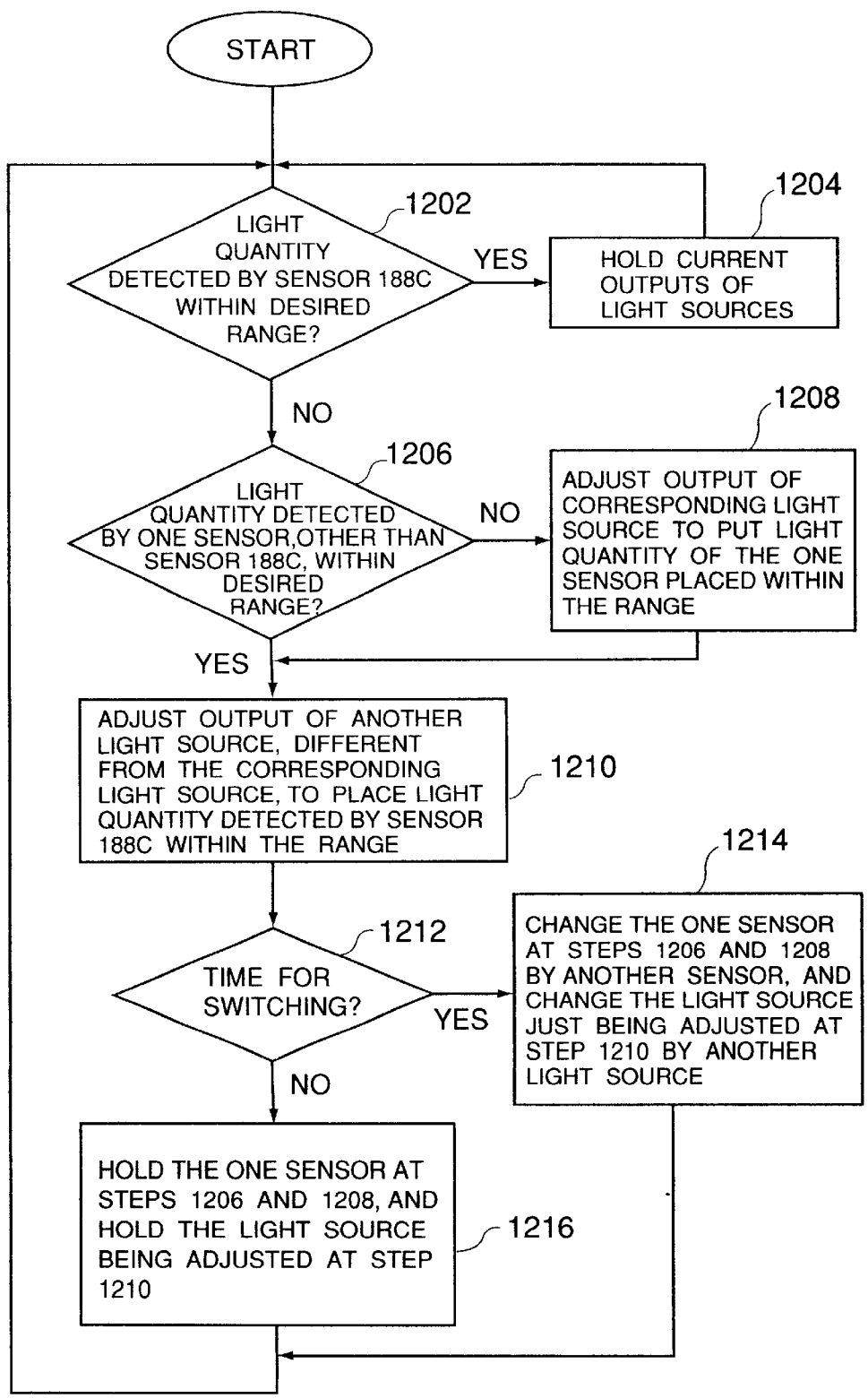
FIG. 21 is a flow chart for explaining an example of long-term illumination control in the illumination control method shown in FIG. 16 and to be done in the illumination system shown in FIGS. 18–20.

Next, referring to FIG. 21, an example of long-term illumination control in the structure of the optical system shown in FIGS. 18–20 will be explained. FIG. 21 is a flow chart of an example of long-term illumination control to be performed by the control unit 190 of the illumination system 100C. If it is assumed that the transmission factor of the masks 188a and 188b changes with time, what can exactly detect the illuminance upon the mask 200 surface being irradiated, for a along term, is the sensor 188c. Since the change in transmission factor of the masks 188a and 188b causes in a long period of term, a change in transmission factor in a short term such as a few hours or a few days can be regarded as approximately zero. In other words, in a short term, the sensors 188a and 188b detect exactly the illuminance on the mask 200 surface.

As the control starts, the control unit 190 discriminates whether the light quantity detected by the sensor 188c is within a predetermined target range or satisfies a predetermined target value (step 1202).

If it is concluded that the light quantity detected by the sensor 188c is within the target range or satisfies the target value (step 1202), then, even if the light quantity detected by the sensor 188a or 188b is concluded as being outside the target range or not satisfying the target value, the control unit 190 holds the current outputs of the lamps 102 (step 1204). Optionally, steps 1106 and 1108 shown in FIG. 17 may be inserted between steps 1202 and 1206.

This is because, as described above, the result of detection by the sensors 188a and 188b is influenced by deterioration of the masks 182a and 182b with time, whereas, if the illuminance on the mask 200 is constant, there is no necessity of adjusting the lamp 102. In other words, the case where the light quantity detected by the sensor 188a or 188b is outside the target range or does not satisfy the target value (step 1204) corresponds to a case wherein, despite that the quantities of light fluxes emitted by the lamps 102 are correct, a notice of incorrect detection of the sensor 188a or 188b due to deterioration of the mask 182 is transmitted to the control unit 190.

On the other hand, if it is concluded that the light quantity detected by the sensor 188c is outside the target range or does not satisfy the target value (step 1202), the control unit 190 then discriminates whether the light quantity detected by one sensor (here, for explanation, it is the sensor 188a) which is other than the sensor 188c is within the target range or satisfies the target value (step 1206). If it is concluded that the light quantity detected by the one sensor (e.g., 188a) other than the sensor 188c is outside the target range or does not satisfy the target value (step 1206), the control unit 190 adjusts the output of the corresponding light source (in this example, the lamp 102a) so that the light quantity detected by the one sensor (188a) comes within the target range or satisfies the target value (step 1208). Optionally, steps 1106 and 1107 of FIG. 17 may be inserted between steps 1206 and 1208.

If it is concluded that the light quantity detected by the sensor (188a in this example) other than the sensor 188c is inside the target range or satisfies the target value (step 1206), or when the step 1208 is finished, it means that the light source (lamp 102a in this example) corresponding to that one sensor is sufficiently stable in short term. Thus, the control unit 190 adjusts the output of another light source (lamp 102b in this example) separate from the aforementioned corresponding light source (lamp 102a in this example) so that the light quantity detected by the sensor 188c comes within the target range or satisfies the target value (step 1210).

In this embodiment, what is adjusted at step 1210 is a single lamp 102. However, where the illumination system has three or more light sources, outputs of two or more light sources may be adjusted. In that occasion, the lamps to be adjusted at step 1210 may be chosen randomly by the control unit 190, or the selection condition may be stored in the memory 192. In this embodiment, as described, the number of lamp or lamps to be adjusted at once is made smaller than the total number of lamps. Even if the lighting state of the lamp 102a changes for a long period, the control unit 190 controls the output of the lamp 102b so that the light quantity emitted from the lamp 102b compensates the change of light emission from the lamp 102a. Therefore, the illuminance on the mask 200 surface can be maintained constant for a long period.

In the control method described above, the transmission factor of the mask 182 gradually increases with time and, therefore, the light quantity detected by the sensor 188a gradually increases even though the output of the lamp 102a is constant. As a result of this, despite the control unit 190 performs constant-illuminance control for the lamp 102a at steps 1206 and 1110, the light quantity from the lamp 102a decreases. At step 1210, the lamp 102b should compensate this, and it leads a possibility of shortening the lifetime of the lamp 102b.

In consideration of it, in the control method shown in FIG. 21, the functions of the lamps 102a and 102b are interchanged at a predetermined time interval (steps 1212 and 1214). More specifically, the control unit 190 discriminates whether a predetermined switching period (for example, the moment whereat successive exposures of one carrier (20 to 50 liquid crystal substrates) are completed, the moment whereat the exposure of a single plate W is completed, every three hours, or at any other arbitrary moment) has bean reached or not (step 1212). Since, generally, the control unit 190 carries out the discrimination at step 1212 while referring to the timer means 194, the procedure at step 1212 may be similar to step 1002. Therefore, the control unit 190 may performs the discrimination at step 1212 by using the result at step 1002.

If it is concluded that the switching period has been reached (step 1212), the control unit 190 changes the one sensor (sensor 188a in this example) at steps 1206 and 1208 by another sensor (sensor 188b in this example), the corresponding light source at step 1208 also being changed from the lamp 102a to the lamp 102b. Also, the control unit changes the light source (lamp 102b in this example) to be adjusted currently at step 1210 to another light source (lamp 102a in this example) (step 1214). If on the other hand it is concluded that the switching period has not been reached, the control unit 190 keeps the one sensor (i.e., sensor 188a) in steps 1206 and 1208 and, also it keeps the light source (i.e., lamp 102b) currently to be adjusted at step 1210 (step 1216). As a result of the procedure at steps 1212 to 1216, the lifetimes of the lamps 102a and 102b can be made approximately equal to each other. This enables replacement of the two lamps 102a and 102b at the same time, and therefore, the period of inoperative state of the illumination system for periodic replacement of the lamp can be shortened to a minimum.

Figure 22:
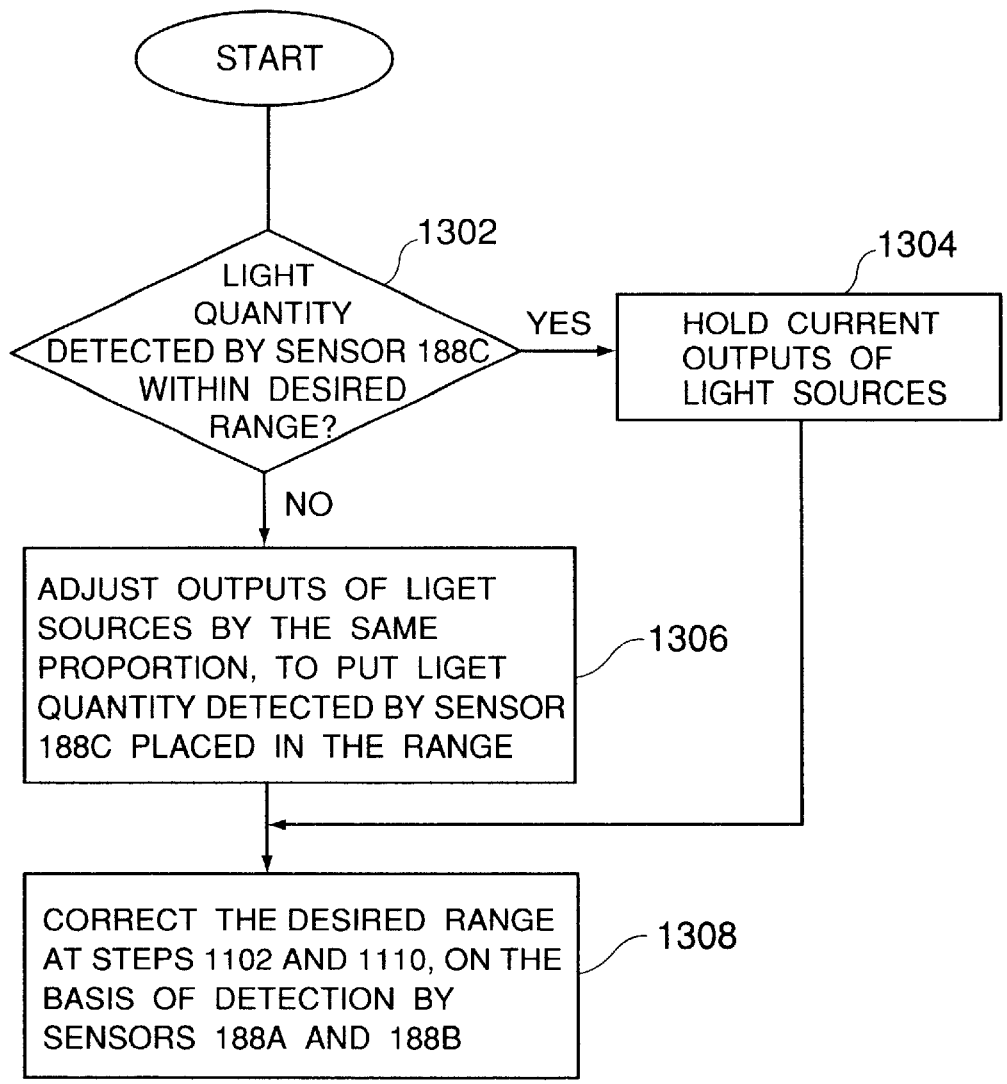
FIG. 22 is a flow chart for explaining another example of long-term illumination control in the illumination control method shown in FIG. 16 and to be done in the illumination system shown in FIGS. 18–20.

Next, referring to FIG. 22, another example of long-term illumination control in the structure of the optical system shown in FIGS. 18–20 will be explained. FIG. 22 is a flow chart for explaining another example of long-term illumination control to be performed by the control unit 190 of the illumination system 100C. As the control starts, the control unit 190 discriminates whether the light quantity detected by the sensor 188c is within a predetermined target range or satisfies a predetermined target value (step 1302). If it is concluded that the light quantity detected by the sensor 188c is within the target range or satisfies the target value (step 1302), then, even if the light quantity detected by the sensor 188a or 188b is concluded as being outside the target range or not satisfying the target value, the control unit 190 holds the current outputs of the lamps 102 (step 1304). Optionally, steps 1106 and 1108 shown in FIG. 17 may be inserted between steps 1302 and 1306.

On the other hand, if it is concluded that the light quantity detected by the sensor 188c is outside the target range or does not satisfy the target value (step 1302), the control unit 190 adjusts (i.e., increase or decrease) the outputs of the lamps 102 (output currents or output voltages) at the same proportion, so that the light quantity detected by the sensor 188c comes within the target range or satisfies the target value (step 1306). In this embodiment, the same proportion control is done, since degradation of the masks 182 can be regarded as being substantially the same.

Subsequently, on the basis of the detection by the sensor 188a or 188b after the adjustment, the control unit 190 corrects the target range or target value for steps 1102 and 1110 (step 1308). More specifically, on the basis of the result of detection by the sensors 188a and 188b as the output signal of the sensor 188c is adjusted to the target value, the target range or target value for steps 1102 and 1110 having been stored in the memory 192, is renewed. As a result of this, at subsequent steps 1102 and 1110, the thus renewed target range or target value is used.

Figure 23:
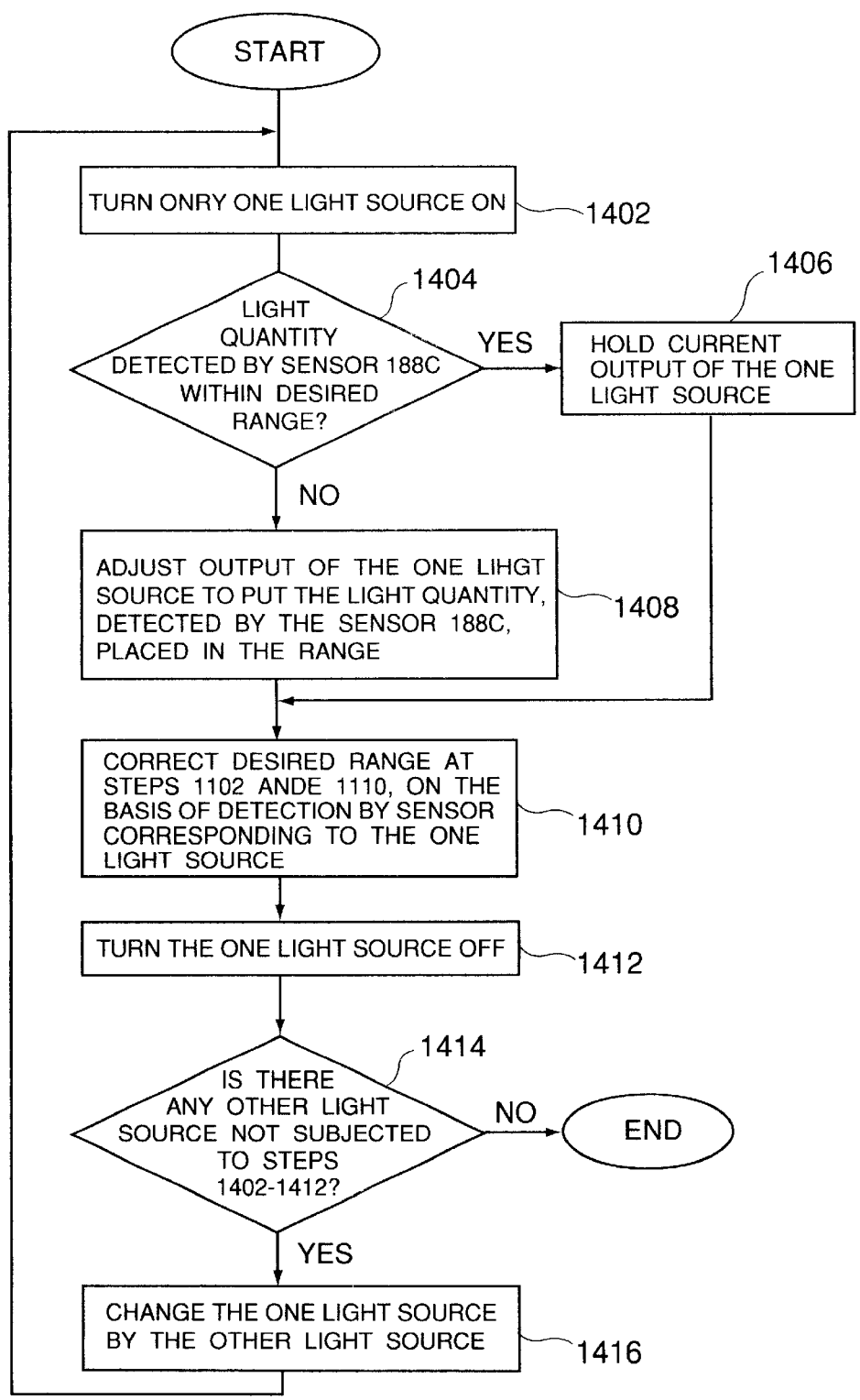
FIG. 23 is a flow chart for explaining a further example of long-term illumination control in the illumination control method shown in FIG. 16 and to be done in the illumination system shown in FIGS. 18–20.

Next, referring to FIG. 23, a further example of long-term illumination control in the structure of the optical system shown in FIGS. 18–20 will be explained. FIG. 23 is a flow chart of an example of long-term illumination control to be performed by the control unit 190 of the illumination system 100C. This embodiment is particularly suitable to a case wherein changes in transmission factor (deterioration with time) of the masks 182a and 182b differ largely, due to an error in the production of parts, for example. In such case, if the control target values of the sensors 188 are renewed on the basis of the illumination control method shown in FIG. 22, there is a possibility that the intensity balance of two light sources at the lens elements 132 of the fly's eye lens 130 is destroyed. If this occurs, the intensity distribution of the effective light source is biased and the telecentricity on the plate W side becomes is deteriorated. In that occasion, if the plate W has a surface unevenness, a deviation of transferred image is produced and the overlay precision is lowered.

As the control starts, the control unit 190 operates to turn on only one light source (in this example, lamp 102a, for convenience) while turning off the other light source (lamp 102b in this example) (step 1402). Lighting the one light source may be made manually by the service person of the exposure apparatus or the illumination system, or it may be made automatically with the control unit 190. In the latter case, the control unit 190 may control the driving circuit for one lamp 102 to turn off the same. Alternatively, a shutter (not shown) to be actuated by an actuator (not shown) may be provided inside the lamp house and disposed on the light path of the lamp 102, and the control unit 190 may control the shutter opening/closure through the actuator while the two lamps are kept turned on. Thus, the lamp extinguishment at step 1412 (and, potentially, at step 1402) is satisfied regardless of the lighting state of the lamp 102, provided that the supply of light from one lamp to the sensor 188 is blocked.

Subsequently, the control unit 190 discriminates whether the light quantity detected by the sensor 188c is within a predetermined target range or satisfies a predetermined target value (step 1404). The target range or target value in this case maybe one to be provided by dividing, by the number of light sources, the range or value as all the light source are turned on. Since this embodiment uses two lamps 102a and 102b, the target range or target value at step 1404 corresponds to a half of the level inherently required at the surface of the mask 200.

If it is concluded that the light source detected by the sensor 188c is inside the target range or satisfies the target value (step 1404), the control unit 190 keeps the current output of the one light source (i.e., lamp 102a in this example) (step 1406).

On the other hand, if it is concluded that the light quantity detected by the sensor 188c is outside the target range or does not satisfy the target value (step 1404), the control unit 190 adjusts the output of the one light source (lamp 102a) so that the light quantity detected by the sensor 188c comes within the target range (step 1408). After step 1406 or 1408, the control unit 190 corrects the target range or target value for steps 1102 and 1110, on the basis of the detection by the sensor (i.e., sensor 188a in this example) corresponding to the one light source (lamp 102a) (step 1410). More specifically, on the basis of the result of detection by the sensors 188a and 188b when the output signal of the sensor 188c is adjusted to the target value, the target range or target value for steps 1102 and 1110 having been stored in the memory 192 is renewed. Thus, in steps 1102 and 1110 to be done subsequently, the thus renewed target range or target value is used. Optionally, steps 1106 and 1118 shown in FIG. 17 may be inserted between steps 1408 and 1410. Subsequently, the control unit 190 turns off the one light source (lamp 102a) (step 1412).

The control unit 190 repeats the procedure at steps 1402 to 1412, for all the light sources. More specifically, the control unit 190 discriminates whether there is another light source to which the procedure at steps 1402–1412 has not yet been executed (step 1414). If it is concluded that there is such a light source, the control unit 190 replaces the one light source (lamp 102a) by such un-adjusted light source (lamp 102b in this example), and it operates to repeat the procedure of steps 1402 to 1412 to all the light sources (step 1416). This applies to a case where three or more light sources are used. If it is concluded that the procedure at steps 1402 to 1412 is completed with respect to all the light sources (step 1414), the control unit 190 closes the process.

In the illumination control method of this embodiment, the illumination control is carried out while tuning on only one light source. Therefore, even if the deterioration in transmission factor differs largely between the masks 182a and 182b, due to an error in production of parts, for example, the light quantities of the light sources can be controlled very precisely.

Figure 24:
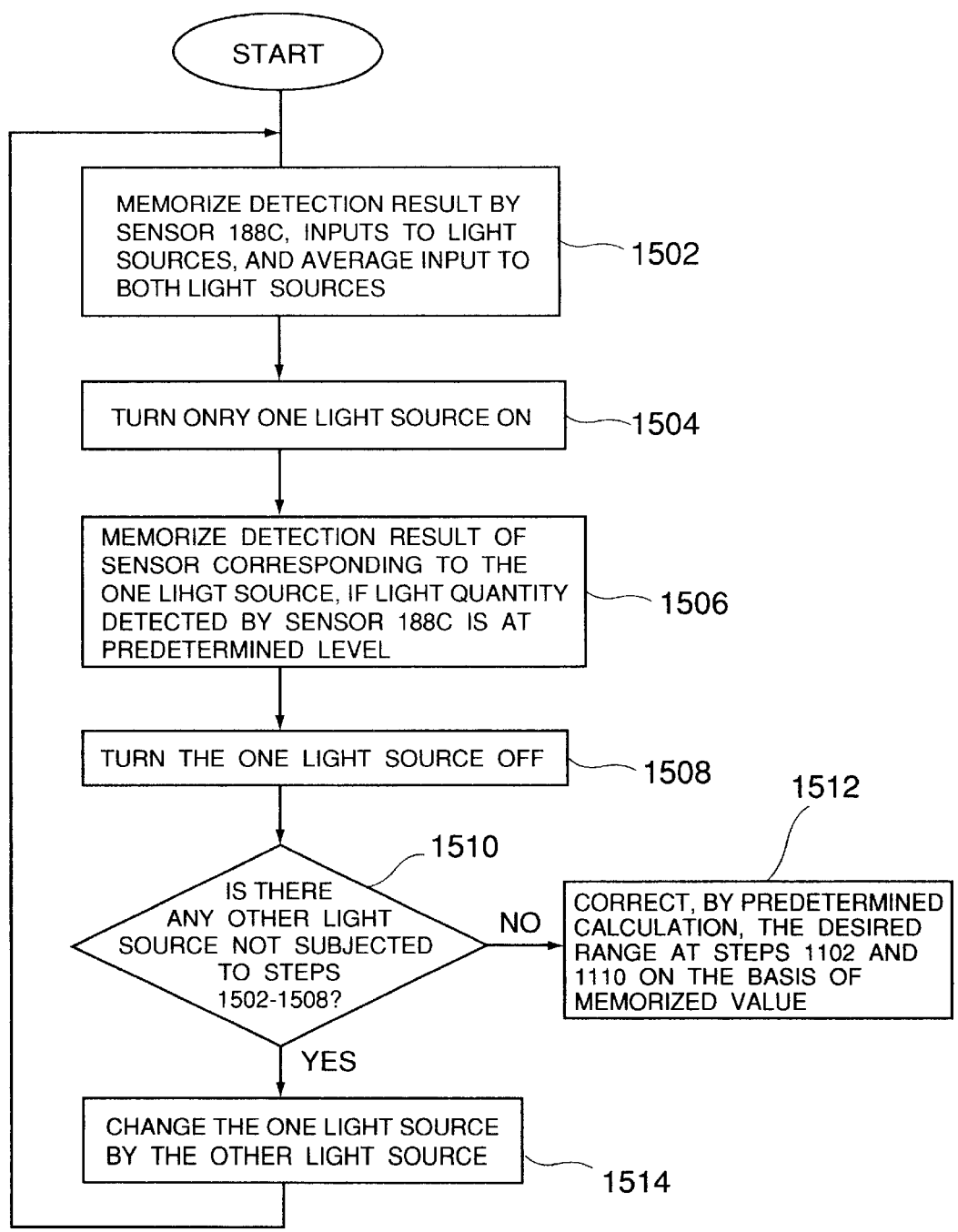
FIG. 24 is a flow chart for explaining a still further example of long-term illumination control in the illumination control method shown in FIG. 16 and to be done in the illumination system shown in FIGS. 18–20.

Next, referring to FIG. 24, another example of long-term illumination control in the structure of the optical system shown in FIGS. 18–20 will be explained. FIG. 24 is a flow chart of an example of long-term illumination control to be performed by the control unit 190 of the illumination system 100C. In the illumination control methods shown in FIGS. 22 and 23, it is assumed that, when the light quantities detected by the sensors 188 are within a predetermined range or satisfy a predetermined value, the intensity distributions of two light sources inside each lens element 132 of the fly's eye lens 130 become substantially the same with each other. On the basis of this, the control unit 190 controls the output of the lamp so that the light quantity detected by each sensor 188, at steps 1102 and 1110, comes within the renewed target range or satisfies the renewed target value in the memory 192. However, in dependent upon the structure of the fly's eye lens 130, the light quantity to be detected by each sensor 188 has a certain tolerance range with respect to a target value. More specifically, the tolerance becomes loosened as the number of stages or the number of rows of the fly's eye lens 130 becomes larger.

First, the tolerance for the intensity distribution of a light source will be explained. For simplicity, an example wherein the intensity of the light source is 50% and 100% (that is, a case where only one light source is turned on) is considered. As the effective light source of the light flux which illuminates the mask 200, there are light source images (in this embodiment, images of the opening of the elliptical mirror 104) corresponding to the number of stages (levels) and the number of rows of the fly's eye lens. Also, it is assumed here that light source images inside the lens element 132 of the fly's eye lens 130 are arrayed laterally (lengthwise direction) at positions spaced, by one-fourth of the outer diameter thereof, from the center of the lens element 132. Then, if two light sources inside each lens element 132 have the same intensity, the gravity center of intensity of the light flux, provided by two light sources, coincides with the center of the lens element 132. If only one light source is turned on, the gravity center of intensity of the light flux shifts from the center of the lens element 132, by an amount corresponding to one-fourth of the outer diameter thereof.

Next, how the outer diameter of each lens element 132 corresponds to NA will be explained. In an LCD production unit-magnification projection exposure apparatus, the F number (Fe) of a projection optical system is Fe=3.5 (NA= 0.14), the resolution limit is 2 microns, and the depth of focus is ±2 microns. In this apparatus, the ratio σ (sigma) of the NA of the illumination optical system to the NA of the projection optical system is 1.0.

For simplification, it is assumed that the illumination light flux of the illumination optical system has a uniform intensity distribution within a range of σ=1.0 and that the fly's eye lens has five stages (levels) and five rows.

The intensity distribution being uniform with σ=1.0 means that the light incident on the fly's eye lens has a uniform intensity distribution and, as a result of it, the light fluxes from the lens elements have the same intensity. The outside diameter of each lens element 132 corresponds to "(NA of the projection optical system)×σ/(number of states or rows of fly's eye lens)". In this case, Fe=0.7(NA=0.028). If only one light source is turned on, the gravity center of intensity of the light flux deviates by an amount corresponding to one-fourth of the outer diameter of the lens element 132. Therefore, Fe=0.18 (NA=0.007). Namely, the result is that an illumination light flux being tilted by Fe=0.18 (NA=0.007) illuminates the mask pattern, and the chief ray of diffraction light (gravity center of the light flux) is also tilted by Fe =0.18 (NA=0.007). Upon the plate W, an image having been printed with 20 microns, the same as the depth of focus, causes a lateral shift of approximately NA (=0.007)×30 microns=0.2 micron.

If the plate has surface unevenness of maximum 60 microns tolerable focus depth (this being in terms of the range because depth is ±30 microns), a pattern transferred thereon has a shift of, at the largest, 0.4 micron. Then, in a case where a pattern of 2 micron corresponding to the limit resolution is to be photo printed, only by the illumination optical system there is produced an image shift of 0.4 micron. This degrades the total overlay. There are many factors for degrading the total overlay which include stage precision, alignment precision, distortion of a projection optical system, etc. The tolerance for the overlay to be caused by all of these factors may reasonably be about one-fifth of the resolution. The tolerance apportioned to the illumination optical system may be about one-fifth of the overall tolerance 0.4 micron, that is, 0.08 micron.

If a fly's eye lens with five stages and five rows is used under the condition that only one light source is turned on, in order to assure an image shift of 0.08 micron, an image shift of 0.4 micron is produced. If it is assumed that the light quantity intensity of one lamp is 100 and that the other lamp has a light quantity intensity of 80, the gravity center of the light flux has a shift of one-twentieth of the outside diameter of the lens element 132. This corresponds to an image shift of 0.08 micron. From the above, it is seen that a tolerance of ±20% is necessary. However, if a fly's eye lens with eight stages and eight rows is used under the same condition, the tolerance is loosened to about ±30%.

Further, as regards the tolerance for total overlay, it is totally 0.4 micron in the case of a fine pattern, whereas it is totally 0.8 micron in the case of a rough pattern. This, it differs with the process.

As a result, the tolerance of a fly's eye lens with five stages and five rows is ±20% for a fine pattern and ±40% for a rough pattern. The tolerance of a fly's eye lens with eight stages and eight rows is ±30% for a fine pattern and ±60% for a rough pattern.

Figure 25:
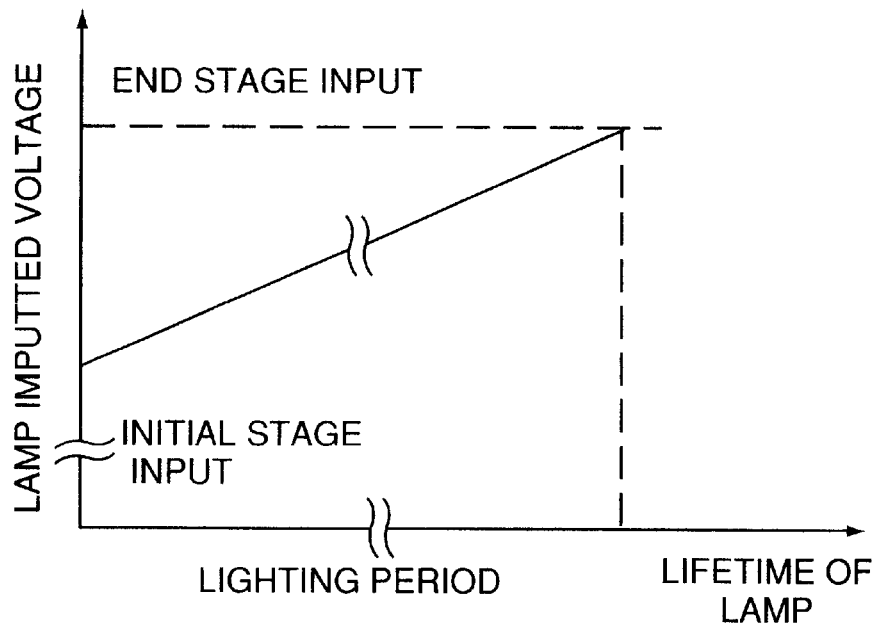
FIG. 25 is a graph for explaining a lifetime curve where a single lamp is kept turned on with a constant illuminance.

Next, the lifetime of the lamp will be explained. If the lifetimes of the lamp 102a and 102b can be made approximately equal to each other, conveniently it enables simultaneous replacement of two lamps and also it minimizes the inoperative period of the apparatus for periodic replacement of the lamp. FIG. 25 shows a lifetime curve in a case where a lamp is lighted with a constant illumination. The lifetime of the lamp 102 continues until the largest electric voltage is reached, as long as the lamp 102 does not burst. For constant illuminance lighting, the illuminance which decreases with the lighting time is compensated by increasing the lamp voltage, by which a constant illuminance can be maintained. The lifetime of a lamp is determined by the voltage supplied thereto. If there is no difference in voltage, the lamp lifetime is approximately constant. Further, there are individual differences in illuminance between lamps and, with the same voltage, there is dispersion of illuminance. However, in the case of an exposure apparatus 1C, even if there is a difference in illuminance between lamps, it does not cause a particular problem as long as the exposure precision is not influenced. As a result, one lamp 102 may be lighted with a constant illuminance so that a desired illuminance is reached, while the other lamp may be operated in a predetermined period with a constant lamp voltage. Thereafter, the lamp voltage may be controlled so that it becomes close to the lamp voltage of the other lamp as much as possible.

In that case, it is necessary to confirm that the difference in illuminance between the lamps is within a tolerable range.

Figure 26:
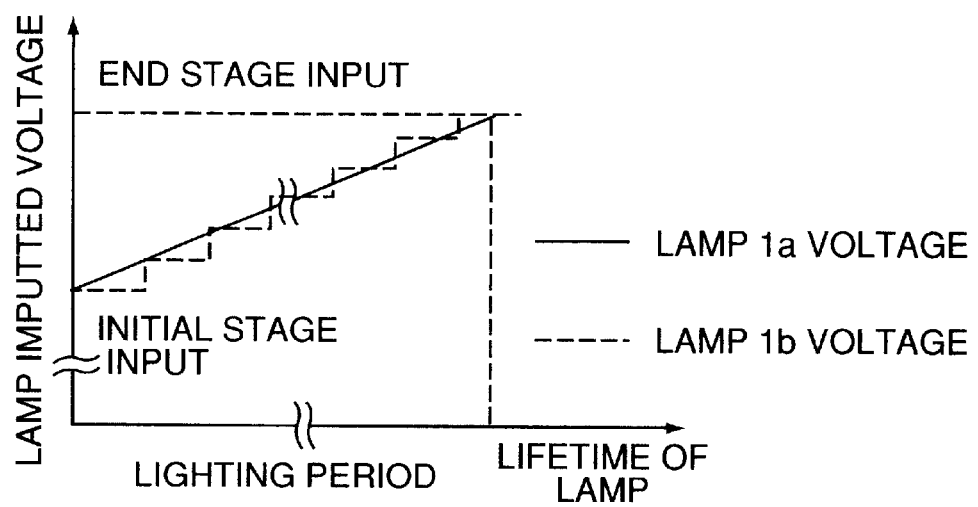
FIG. 26 is a graph for explaining the relation between the lighting period and the lamp voltage where the lamp control is performed.
Figure 27:
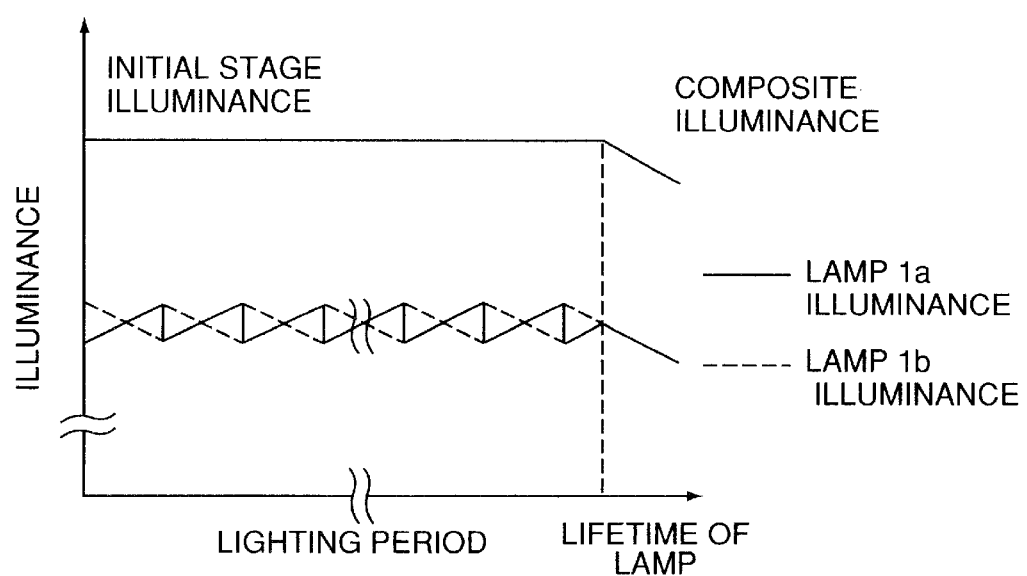
FIG. 27 is a graph for explaining the relation between the lighting period and the illuminance.

FIG. 26 illustrates the relation between the lamp lighting time and the lamp voltage, where the lamps 102a and 102b are controlled. FIG. 27 illustrates the relation between the lighting time and the illuminance. The voltage of the lamp 102b is raised stepwise for regular intervals by the control system 190, so that it becomes equal to the voltage of the lamp 102a. The voltage of the lamp 102a is feedback controlled by the control unit 190 so that the combined illuminance of the lamps 102a and 102b as detected by the sensor 188c becomes constant. Thus, the lamp voltage rises approximately linearly.

Where the tolerance is relatively loose as ±30%, the detection results of the sensors 188a and 188b may involve a difference within a tolerable range. By controlling the input to the lamps 102a and 102b from a lighting device strictly as by ±3%, for example, the lighting control for rendering the lifetimes of both lamps 102 substantially the same is enabled.

Referring to FIG. 24, as the control starts, the control unit 190 stores, into the memory 192, the light quantity C as detected by the sensor 188c while the lamps 102 are kept turned on, the inputs to the lamps 102, and an average input to the lamps 102 (step 1502). Here, while the word "input" refers to an input electric current level or an input electric voltage level, in this embodiment an input electric current level is used. Also, the input electric current to the lamp 102a is denoted by Pa, the input electric current to the lamp 102b is denoted by Pb (≠Pa), and the average input electric current is denoted by Pw (=(Pa+Pb)/2).

Subsequently, the control unit 190 turns on only one light source (for convenience, lamp 102a in this example) and turns off the other light source (lamp 102b in this example). Lighting the one light source may be made manually by the service person of the exposure apparatus or the illumination system, or it may be made automatically with the control unit 190. In the latter case, the control unit 190 may control the driving circuit for one lamp 102 to turn off the same. Alternatively, a shutter (not shown) to be actuated by an actuator (not shown) may be provided inside the lamp house and disposed on the light path of the lamp 102, and the control unit 190 may control the shutter opening/closure through the actuator while the two lamps are kept turned on. Thus, the lamp extinguishment at step 1508 (and, potentially, at step 1504) is satisfied regardless of the lighting state of the lamp 102, provided that the supply of light from one lamp to the sensor 188 is blocked.

In the state in which the lighting of the aforementioned one light source (lamp 102a in this example) is kept stable, the control unit 190 adjusts the input current to the one light source (lamp 102a) so that the output value of the sensor 188c becomes equal to a predetermined level (equal to (Pw/Pa)×C/2 in this embodiment) (step 1506). The input current to the one light source (lamp 102a) at this time is approximately equal to Pw. Here, as regards the predetermined level, from the tolerance of the fly's eye lens 130, it may be 1.3 where the value Pw/Pa is not smaller than 1.3, and it maybe 0.7 where the value Pw/Pa is not greater than 0.7. Namely, an upper limit of 1.3 and a lower limit of 0.7 may be set. This corresponds to the tolerance ±30%. Here, the detection result Da' of the sensor 188a corresponding to the aforementioned one light source (lamp 102a) is stored into the memory 192 (step 1506). The control unit 190 then extinguishes the one light source (lamp 102a) (step 1508).

The control unit 190 repeats the procedure from step 1502 to step 1508 with respect to all the light sources. More specifically, the control unit discriminates where there is another light source to which the procedure at steps 1502 to 1508 has not yet been performed or not (step 1510). If it is concluded that there is such a light source, the control unit 190 replaces the aforementioned one light source (lamp 102a in this example) by the other light source (lamp 102b in this example), and the procedure from step 1502 to step 1508 is repeated for all the light sources (step 1514). This is also the case with an embodiment where three or more light sources are used. If it is concluded that the procedure of steps 1502 to 1508 has been completed to all the light sources (step 1512), the control unit 190 stores Da' and Db' into the memory 192. The detection result of the sensor 188c where the detection results of the sensors 188a and 188b are Da' and Db' is given by:

$$(Pw/Pa)(C/2)+(Pw/Pb)(C/2)=C/(4Pa \times Pb)$$

Finally, target values Da and Db for the sensors 188a and 188b, where constant illuminance lighting is to be done, are calculated as follows.

$$Da=Da'\{4(Pa \times Pb)/(Pa+Pb)^2\}$$

$$Db=Db'\{4(Pa \times Pb)/(Pa+Pb)^2\}$$

The control unit 190 corrects the target range or target value at steps 1102 and 1110 to the thus obtained value Da or Db (step 1512). In accordance with this embodiment, the lifetimes of the lamps can be made approximately the same.

The mask 200 has a pattern formed thereon. Diffraction light produced by the mask 200 goes through the projection optical system 300 and forms an image of the pattern upon the plate W. The plate W comprises a workpiece such as a wafer or a liquid crystal substrate, on which a resist has been applied. The slit 134 and the mask 200 are placed optically in a positional relation of an object plane and an image plane. Such relation may be called in this specification also as a conjugate relation. The light exit surface 234 of the fly's eye lens 232 and the mask 200 are placed in a Fourier transform relation. Also, the mask 200 and the plate W are in a conjugate relation.

In the case of a scanning exposure apparatus, the mask 200 and the plate W are scanningly moved by which the pattern of the mask 200 is transferred to the plate W. In the case of a stepper (step-and-repeat type exposure apparatus), the exposure process is performed while the relative position of the mask 200 and the plate W is held fixed (stationary).

The projection optical system 300 may comprise an optical system having lens elements only, an optical system having lens elements and at least one concave mirror, or an optical system having lens elements and at least one diffractive optical element such as Kinoform, for example. If correction of chromatic aberration is necessary, lens elements made of glass materials having different dispersion values (abbe's numbers) may be used, or the diffractive optical element may be arranged to produce dispersion in the opposite direction to the lens elements.

The plate W has a coating of photoresist. The photoresist coating procedure includes a pre-process, an adherence enhancing agent application process, a photoresist application process, and a pre-baking process. The pre-process includes washing, drying, etc. The adherence enhancing agent application process is a treatment for improving the surface property to improve the adherence between the photoresist and a background layer. An organic film such as HMDS (Hexamethyl-disilazane) is coated or vapor deposited. The pre-baking is a baking process, but it is gentle as compared with that to be done after the development process. This is done to remove the solvent. The mask 200 and the plate W are moved in opposite directions at predetermined speeds, in synchronism with each other.

In the exposure process, the light fluxes emitted from the lamp 102 advance in a direction from the back face to the front face of the sheet of the drawing of FIG. 1, 9 or 10. The light fluxes are then reflected by elliptical mirrors 104. Except the light from the lamp 102c shown in FIG. 10, the light fluxes are thereafter deflected by the first deflecting mirror 106 by which their light path is bent from vertical to horizontal. After this, the light fluxes are collected at convergent points a–c, respectively. Each of light fluxes collected at the convergent points thereafter goes through the first collimator lens 108, by which it is transformed into an approximately parallel light flux. Except the light from the lamp 102c in FIGS. 9 and 10, the light fluxes are then deflected in a horizontal plane by the second deflecting mirror 110. After this, in FIG. 10, the light is deflected by the deflecting mirror 118 toward the second collimator lens 120. The light fluxes passing through the second collimator lens 120 are then combined with each other at the light entrance surface of the fly's eye lens 130, the integrator 140 or any other integrator.

The light flux emitted from the integrator 130 or 140 passes through the condenser lens 160 and it is deflected by the deflecting mirror 162. Thereafter, it illuminates the slit 164. The light flux passing through the slit 164 goes through the imaging optical system 168 and, after this, it irradiates the surface of the mask 200. The condenser lens 164 serves to illuminate the slit 164 and the mask 200 uniformly, in accordance with Koehler illumination, by use of the light emitted from the integrator.

A portion of the light flux deflected by the deflecting mirror 162 is split by the deflecting mirror 170 or 171 into a transmitted light flux and a reflected light flux to illuminate the pinhole 172 uniformly. The transmitted light is collected by the lens 180a upon the mask 182 which is placed at a position optically conjugate with the mask 200 surface to be illuminated. The reflected light is collected by the lens 180b upon the mask 182b which is placed at a position conjugate with the mask 200 surface to be illuminated. Here, upon the masks 182, images of the light exit surface of the fly's eye lens 130 are re-imaged.

The light passing through the mask 182a corresponds to the light flux emitted from the lamp 102a. The light passing through the mask 182b corresponds to the light flux emitted from the lamp 102b. These light from the masks 182 goes through the lens 186 and enters the sensor 188. As a result, each sensor 188 can detect the quantity of light emitted from one light source and actually projected on the mask 200 surface. Since the detection result such as above is used, the control unit 190 can perform short-term and long-term illumination controls of the light sources very precisely. Further, the exposure apparatus 1 in which such illumination system is incorporated is able to perform high precision exposure amount control. Therefore, high precision pattern transfer to the resist is assured, and production of high quality devices such as semiconductor chips, LCD elements, image pickup devices (CCD), thin film magnetic heads, for example, is enabled.

Next, referring to FIGS. 28 and 29, an embodiment of a device manufacturing method which uses one of the illumination systems described above, will be explained.

Figure 28:
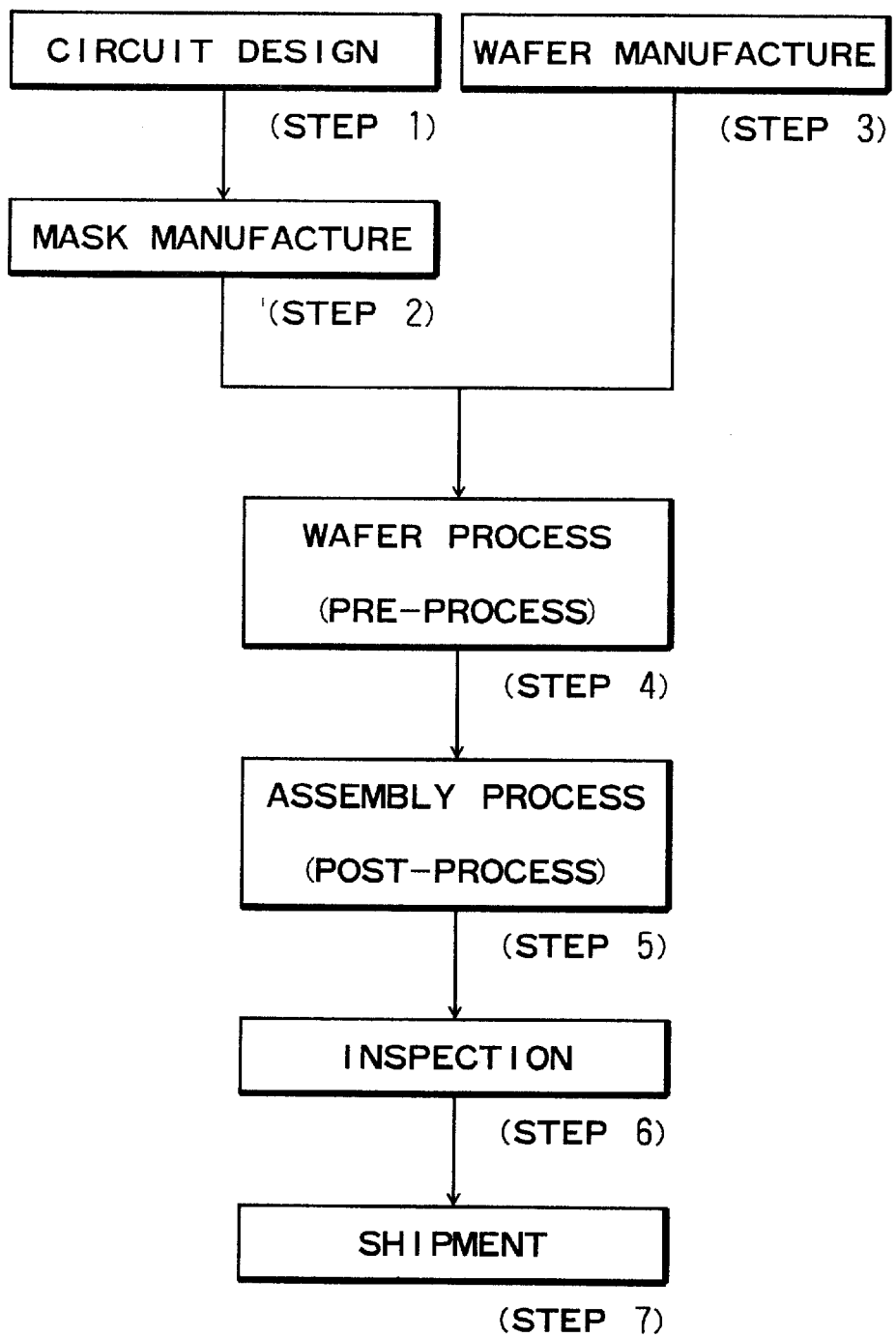
FIG. 28 is a flow chart for explaining device manufacturing processes, including an exposure process according to the present invention.

FIG. 28 is a flow chart for explaining the procedure of manufacturing various microdevices such as semiconductor chips (e.g., ICs or LSIs), liquid crystal panels, or CCDs, for example. Here, production of semiconductor chips will be explained, as an example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, circuit is formed on the wafer in practice, through the lithography. Step 5 subsequent to this is an assembling step which is called a post-process wherein the wafer having been processed at step 4 is formed into semiconductor chips. This step includes assembling (dicing and bonding) process and packaging (chip sealing) process. Step 6 is an inspection step wherein the operation check, the durability check an so on for the semiconductor devices produced by step 5, are carried out. With these processes, semiconductor devices are produced and they are shipped (step 7).

Figure 29:
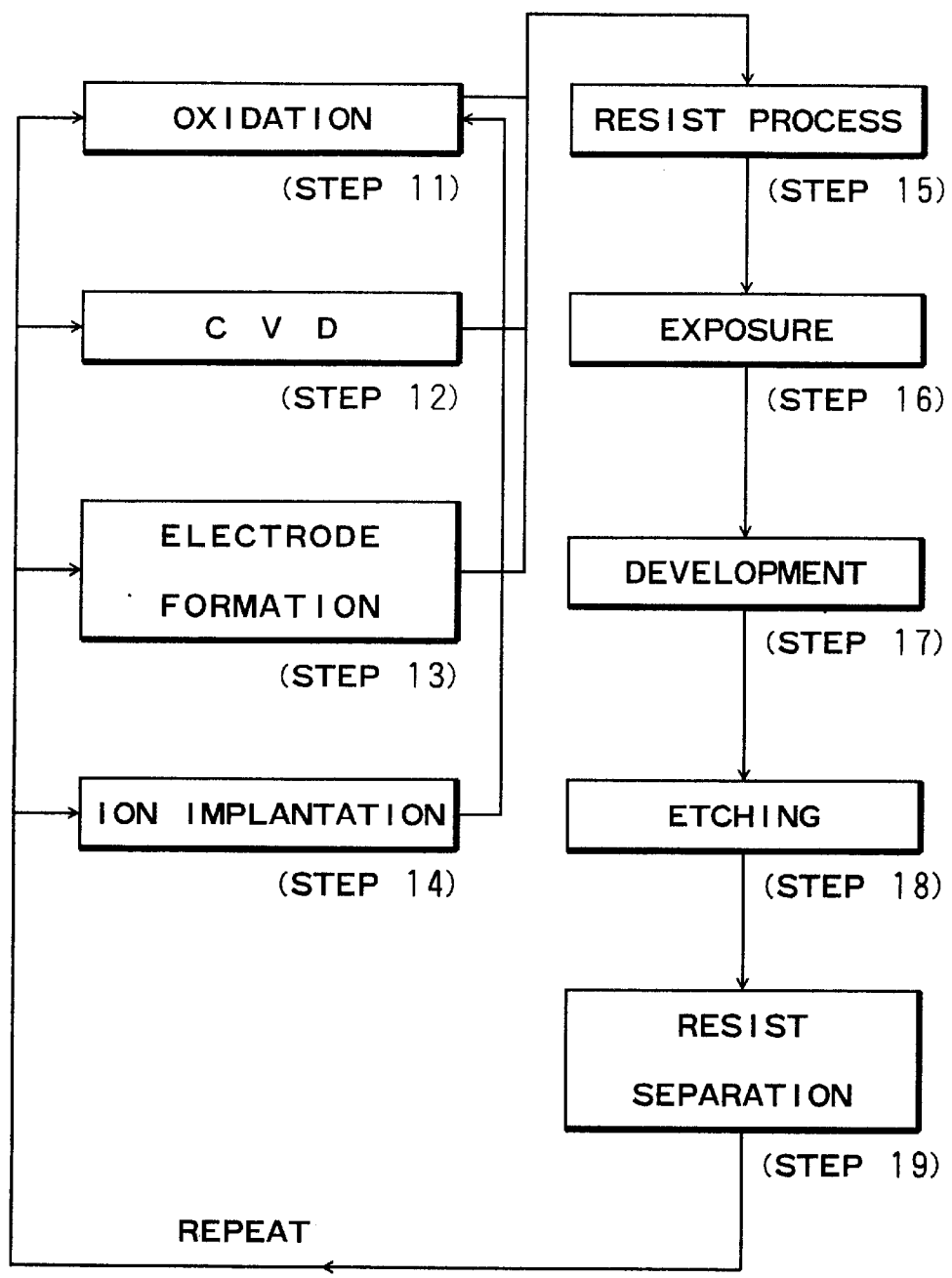
FIG. 29 is a flow chart for explaining details of a wafer process at step 4 in FIG. 28.

FIG. 29 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high quality microdevices can be manufactured.

In accordance with illumination systems and exposure apparatuses described hereinbefore, on the basis of the light quantity of a single light flux divided by the second optical system, the light quantity of a corresponding light source is measured very precisely. As a result of this, particularly through the high precision exposure amount control, high quality processes can be done to workpieces. Further, with this arrangement, the light quantity balance of plural light sources can be adjusted and the telecentricity can be controlled at a predetermined level. This enables total overlay control and thus improvement of the same. Further, a sensor system necessary for each of plural light sources can be made simple and compact, and also it can be provided by an inexpensive structure. Therefore, an illumination system having plural light sources and an exposure apparatus having such an illumination system can be accomplished at a lower cost.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:
    a first optical system for combining plural light fluxes from plural light sources and for projecting the plural light fluxes to a surface to be illuminated;
    a second optical system for separating a portion of one of the combined plural light fluxes; and
    a first detecting system for detecting the light quantity of the portion separated by said second optical system independently from a light quantity related to another of the combined plural light fluxes.

2. An illumination system comprising:
a first optical system for combining plural light fluxes from plural light sources and for projecting the plural light fluxes to a surface to be illuminated;
a second optical system for separating a portion of each of the combined plural light fluxes; and
a first detecting system for detecting the light quantity of each of the portions separated by said second optical system.

3. An illumination system according to claim 2, further comprising a control system connected to said first detection system and for controlling the quantity of light emission or the luminous intensity of one or more of said plural light sources corresponding to the one light flux or each light fluxes on the basis of the detection by said first detecting system.

4. An illumination system according to claim 2, further comprising a second detecting system for detecting the total light quantity of a certain portion of the plural light fluxes combined by said first optical system.

5. An illumination system according to claim 4, further comprising a control system connected to said second detecting system and for controlling the quantity of light emission or the luminous intensity of at least one of said plural light sources on the basis of the detection by said second detecting system.

6. An illumination system according to claim 2 wherein said first optical system comprises an optical integrator for forming a number of secondary light sources by use of light from said plural light sources, and a condenser for superposing light fluxes from said secondary light sources one upon another on the surface to be illuminated, wherein said second optical system comprises an aperture for transmitting the one light flux of the light fluxes from said secondary light sources, and wherein a light exit surface of said integrator and said aperture are disposed in an optically conjugate relationship.

7. An illumination system according to claim 6, wherein said integrator comprises a fly's eye lens system or plural sets of cylindrical lens arrays having generating lines extending orthogonally with each other.

8. An illumination system according to claim 4, wherein said control system controls the light emission quantity or the luminous intensity of a particular light source of said plural light sources so that said second detecting system detects a constant light quantity.

9. An illumination system according to claim 8, wherein said control system operates to change the particular light source by another light source at predetermined time intervals.

10. An illumination system according to claim 9, wherein said control system is connected to an outside unit for determining the predetermined time intervals.

11. An illumination system according to claim 4, wherein said control system controls the light emission quantities or the luminous intensities of said plural light sources at the same proportions, so that said second detecting system detects a constant light quantity.

12. An illumination system according to claim 11, wherein said control system has a memory for storing therein the light emission quantities of said plural light sources controlled at the same proportion, and wherein said control system controls the light emission quantity of the light source on the basis of the light emission quantity stored in said memory and of the detection by said first detecting system.

13. An illumination system according to claim 4, wherein a control system operates to turn only one light source on and to control the light quantity of the one light source so that the light quantity detected by said second detecting system reaches a predetermined target value, wherein said illumination system further comprises a memory for storing therein the result of detection by said first detecting system produced after the light quantity detected by said second detecting system reaches the target value, and wherein said control system controls the light emission quantity of the light source so that the light quantity detected thereafter by said first detecting system is kept within a predetermined tolerance range with respect to the result of detection.

14. An illumination system according to claim 13, wherein said first optical system comprises an optical integrator for forming a number of secondary light sources by use of light from said plural light sources, and a condenser for superposing light fluxes from said secondary light sources one upon another on the surface to be illuminated, and wherein the tolerance range is determined by the number of stages and the number of rows of said optical integrator.

15. An illumination system according to claim 14, wherein the control based on the light quantity detected by said second detecting system is performed at predetermined time intervals.

16. An illumination system according to claim 15, further comprising timer means for measuring the light emission time of at least one of said light sources, and discriminating means for discriminating whether the time measured by said timer means reaches the predetermined time interval, wherein, when it is concluded by said discriminating means that the light emission time reached the predetermined time interval, said timer means initiates fresh measurement of the emission time of the light source.

17. An illumination system according to claim 6, wherein said control system has a memory for storing therein data concerning deterioration of said aperture.

18. An illumination system according to claim 7, wherein said fly's eye lens comprises plural lens elements each having a rectangular sectional shape, wherein the plural light fluxes are arrayed at or in the vicinity of light exit surfaces of said lens elements, and wherein a mask having a light transmitting portion for transmitting one of the plural light fluxes arrayed at the lens elements is provided.

19. An illumination system according to claim 2 wherein the surface to be illuminated and a light receiving surface of said first detecting system are placed in an optically conjugate relationship.

20. An exposure apparatus for illuminating a reticle or a mask by use of an illumination system as recited in claim 1 or 2, and for exposing on a workpiece with a pattern formed on the surface being illuminated.

21. An apparatus according to claim 20, further comprising a third optical system for projecting the pattern of the reticle or the mask onto the workpiece, wherein the workpiece comprises a glass plate for an LCD, and wherein the pattern is transferred to the workpiece through a scan of the reticle or the mask and the workpiece.

22. A control system, comprising:
an optical system for separating a portion of one of plural light fluxes emitted from plural light sources and being separatably combined;
detecting means for detecting the light quantity of the portion of the one light flux separated; and
control means for controlling the light quantity of one of the plural light sources corresponding to the one light flux, on the basis of the detection by said detecting means.

23. An illumination method, comprising the steps of:
discriminating whether a first light quantity, of a first light flux separated from plural light fluxes which are emitted from plural light sources, including a first light source for emitting the first light flux, and which are being separatably combined, is within a first target range; and
controlling the output of said first light source, when it is concluded that the first light quantity is outside the first target range, so that the first light quantity is kept within the first target range.

24. A method according to claim 23, wherein, in said controlling step, the first light quantity as measured at a position optically equivalent to a surface to be illuminated when the second light flux is used.

25. A method according to claim 23, further comprising discriminating whether a second light quantity of the second light flux is within a second target range, and holding the output of said first light source when it is concluded that the second light quantity is outside the second target range even though the first light quantity is being concluded as not being inside the first target range.

26. A method according to claim 24, further comprising discriminating whether a second light quantity of the second light flux is within a second target range, and controlling the output of one of the light sources when it is concluded that the second light quantity is outside the second target range, so that the second light quantity is kept within the second target range.

27. A method according to claim 26, further comprising discriminating whether a predetermined time has elapsed, and changing the one light source by another when it is concluded that the predetermined time has elapsed.

28. A method according to claim 23, further comprising discriminating whether a second light quantity of the second light flux is within a second target range, and controlling the outputs of the plural light sources at the same proportion so that the second light quantity is kept within the second target range.

29. A method according to claim 28, further comprising correcting the first target range on the basis of the first light quantity as detected after the second light quantity is kept inside the second target range.

30. A method according to claim 25, further comprising discriminating whether a predetermined time is elapsed, and discriminating, each time the lapse of predetermined time is concluded, whether the second light quantity is within the second target range.

31. A method according to claim 23, further comprising
(i) a step which uses a first detecting system being optically connected to a separating optical system for separating the first light flux from the second light flux and being operable to detect the first light quantity of the first light flux, and a second detecting system being optically connected to a combining optical system for producing the second light flux and being operable to detect the second light quantity of the second light flux, and which functions to turn only the first light source on,
(ii) a step for controlling the first light source so that the first light quantity as detected by the second detecting system reaches a target value, and
(iii) a step for correcting the first target range on the basis of the first light quantity as detected by the first detecting system.

32. A method according to claim 23, further comprising
(i) a step which uses a first detecting system being optically connected to a separate optical system for separating the first light flux from the second light flux and being operable to detect the first light quantity of the first light flux, and a second detecting system being optically connected to a combining optical system for producing the second light flux and being operable to detect the second light quantity of the second light flux, and which functions to turn only the first light source on, and
(ii) a step for correcting the first target range on the basis of the first light quantity as detected by the first detecting system, when the first light quantity as detected by the second detecting system is at a predetermined value, wherein the predetermined value is determined on the basis of a tolerance which at least partially depends on the combining optical system.

33. A method according to claim 31, further comprising discriminating whether a predetermined time is elapsed, wherein the first target range is corrected each time the elapse of predetermined time is concluded.

34. A device manufacturing method, comprising the steps of:
exposing a workpiece by use of an illumination light flux controlled in accordance with an illumination method as recited in claim 24; and
performing a predetermined process to the exposed workpiece.

35. A device manufacturing method, comprising the steps of:
exposing a substrate with a device pattern by use of an exposure apparatus as recited in claim 20; and
developing the exposed substrate.

36. A device manufacturing method, comprising the steps of:
exposing a substrate with a device pattern by use of an exposure apparatus as recited in claim 21; and
developing the exposed substrate.

* * * * *

UNITED STATES PATENT AND TRADEMARK OFFICE
CERTIFICATE OF CORRECTION

PATENT NO. : 6,727,982 B2
DATED : April 27, 2004
INVENTOR(S) : Haruna Kawashima et al.

It is certified that error appears in the above-identified patent and that said Letters Patent is hereby corrected as shown below:

Column 7,
Line 30, please delete "a" and insert therefore -- a --

Column 25,
Line 12, please delete "a" and insert therefore -- a --

Signed and Sealed this

Sixteenth Day of November, 2004

JON W. DUDAS
*Director of the United States Patent and Trademark Office*